(12) United States Patent
Lee et al.

(10) Patent No.: US 11,640,980 B2
(45) Date of Patent: May 2, 2023

(54) FIELD-EFFECT TRANSISTOR, FIELD-EFFECT TRANSISTOR ARRAY STRUCTURE AND METHOD OF MANUFACTURING FIELD-EFFECT TRANSISTOR

(71) Applicant: Samsung Electronics Co., Ltd., Suwon-si (KR)

(72) Inventors: Kwanghee Lee, Hwaseong-si (KR); Sangwook Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 71 days.

(21) Appl. No.: 17/399,175

(22) Filed: Aug. 11, 2021

(65) Prior Publication Data
US 2022/0149166 A1 May 12, 2022

(30) Foreign Application Priority Data

Nov. 11, 2020 (KR) .................. 10-2020-0150512

(51) Int. Cl.
*H01L 29/423* (2006.01)
*H01L 27/088* (2006.01)
(Continued)

(52) U.S. Cl.
CPC ........ *H01L 29/4236* (2013.01); *H01L 27/088* (2013.01); *H01L 29/0649* (2013.01); *H01L 29/24* (2013.01); *H01L 29/7813* (2013.01)

(58) Field of Classification Search
CPC ... H01L 27/088; H01L 29/0649; H01L 29/24; H01L 29/4236; H01L 29/7813
(Continued)

(56) References Cited

U.S. PATENT DOCUMENTS 6,316,315 B1    11/2001  Hofmann et al.
8,796,752 B2 *  8/2014   Sim ...................... H01L 21/764
                                                        257/314
(Continued)

FOREIGN PATENT DOCUMENTS

KR         10-0963165 A      1/2005
KR         10-0880377 B1     1/2009
KR     10-2013-0011942 A     1/2013

OTHER PUBLICATIONS

W. Jang et al. 'Design and Optimization of Germanium-Based Gate-Metal-Core Vertical Nanowire Tunnel FET' *Micromachines*, 2019, 10, 749, pp. 1-9.

*Primary Examiner* — Monica D Harrison
(74) *Attorney, Agent, or Firm* — Harness, Dickey & Pierce, P.L.C.

(57) ABSTRACT

A field-effect transistor includes a gate structure comprising a structure in which a first insulating layer, a first gate electrode, and a second insulating layer are sequentially stacked on a first conductive layer, the gate structure surrounding a first hole through the first insulating layer and exposing a part of the first conductive layer; a second conductive layer on the second insulating layer and surrounding a second hole connected to the first hole and exposing a part of the first conductive layer; a first gate insulating layer covering an inner wall of the gate structure exposed by the first hole; a semiconductor layer covering a part of the first conductive layer exposed through the first hole and the second hole, the first gate insulating layer, and the second conductive layer; a second gate insulating layer covering the semiconductor layer; and a second gate electrode filling the first and second holes.

26 Claims, 21 Drawing Sheets

(51) Int. Cl.
*H01L 29/78* (2006.01)
*H01L 29/06* (2006.01)
*H01L 29/24* (2006.01)

(58) Field of Classification Search
USPC .......................................................... 257/43
See application file for complete search history.

(56) References Cited

U.S. PATENT DOCUMENTS

| | | |
|---|---|---|
| 9,177,872 B2 | 11/2015 | Sandhu |
| 9,691,777 B2 * | 6/2017 | Miyazaki .......... H01L 29/42324 |
| 9,805,954 B2 | 10/2017 | Ishizuka et al. |
| 2008/0296674 A1 | 12/2008 | Graham et al. |

* cited by examiner

FIELD-EFFECT TRANSISTOR, FIELD-EFFECT TRANSISTOR ARRAY STRUCTURE AND METHOD OF MANUFACTURING FIELD-EFFECT TRANSISTOR

CROSS-REFERENCE TO RELATED APPLICATION

This application is based on and claims priority under 35 U.S.C. § 119 to Korean Patent Application No. 10-2020-0150512, filed on Nov. 11, 2020, in the Korean Intellectual Property Office, the disclosure of which is incorporated by reference herein in its entirety.

BACKGROUND

Some example embodiments relate to a field-effect transistor, a field-effect transistor array structure, and/or a method of manufacturing the field-effect transistor, and more particularly to, a field-effect transistor including a channel layer extending in a vertical direction.

In recent years, in accordance with the demand/desire of the semiconductor industry to reduce production costs of electronic products and/or to improve the degree of integration due to the emergence of ultra-large-scale integrated circuits, high integration is desired for memory semiconductor devices and/or logic semiconductor devices including field-effect transistors. In a process of high integration of semiconductor devices, research has been conducted to reduce off-current caused by a channel length of tens or several nanometers. Alternatively or additionally, research into a reduction in subthreshold swing (SS) is also being conducted to clarify a distinction between on/off states of semiconductor devices.

Meanwhile, oxide semiconductors are known to have characteristics capable of reducing the off current and the SS of a field-effect transistor. Accordingly, a method of forming a channel layer of a field-effect transistor using an oxide semiconductor has been proposed.

However, in a case of a field-effect transistor including a channel layer to which an oxide semiconductor is applied, according to high integration of a semiconductor device, as the physical limitation of a planar device size and a length of the channel layer representing the device size decreases, a phenomenon known as a short-channel effect, in which the performance of the device may deteriorate, occurs.

A known way of overcoming this is a method of manufacturing a field-effect transistor including a plurality of gate electrodes so as to reduce or minimize the influence of a short-channel effect by increasing the controllability of gate electrodes in the field-effect transistors. Alternatively or additionally, fabricating a field-effect transistor may be possible, wherein the field-effect transistor has a three-dimensional structure capable of increasing a length of the channel layer, while the fabrication may reduce the size of the field-effect transistor by forming a channel layer having a three-dimensional form extending in a vertical direction, rather than forming the channel layer of the field-effect transistor on a horizontal plane.

SUMMARY

Provided is a field-effect transistor including a channel layer extending in a vertical direction, and having the three-dimensional shape with a double gate structure of a three-dimensional shape including a first gate electrode and a second gate electrode driven independently of the first gate electrode, with the first gate electrode surrounding the channel layer.

Provided is a field-effect transistor array structure including a plurality of field-effect transistors including a double gate structure having a three-dimensional shape.

Provided is a method of fabricating an electronic device including a double gate structure of a three-dimensional shape.

Additional aspects will be set forth in part in the description which follows and, in part, will be apparent from the description, or may be learned by practice of the example embodiments.

According to some example embodiments, a field-effect transistor includes a first conductive layer, a gate structure comprising a structure including a first insulating layer, a first gate electrode, and a second insulating layer, the first insulating layer, the first gate electrode, and the second insulating layer being sequentially stacked on the first conductive layer, the gate structure surrounding a first hole through the first insulating layer, the first gate electrode, and the second insulating layer, the first hole exposing a part of the first conductive layer, a second conductive layer on the second insulating layer, the second conductive layer surrounding a second hole connected to the first hole, the second hole exposing a part of the first conductive layer, a first gate insulating layer covering an inner wall of the gate structure exposed by the first hole, a semiconductor layer covering a part of the first conductive layer exposed through the first hole and through the second hole, the first gate insulating layer, and the second conductive layer, a second gate insulating layer covering the semiconductor layer, and a second gate electrode on the second gate insulating layer and filling the first hold and the second hole.

The first conductive layer and the second conductive layer comprise at least one of a metal or a metal compound.

The second gate insulating layer is apart from the second conductive layer with the semiconductor layer between the second gate insulating layer and the second conductive layer.

The first gate insulating layer does not cover the second conductive layer.

The second hole has a tapered shape.

A diameter of the second hole gradually increases in a direction away from the first conductive layer.

The semiconductor layer comprises an oxide semiconductor material.

The oxide semiconductor material comprises an oxide comprising at least one element selected from In, Zn, Sn, Ga, Al, Mg, Hf, and lanthanide elements.

The first and second gate insulating layers comprise a perovskite material.

The first and second gate insulating layers comprise a ferroelectric material in which at least one of HfO, $Hf_xZr_{1-x}O$, and ZrO is doped with at least one of Si, Al, Zr, Y, La, Gd, Sr, and Hf.

The first insulating layer comprises at least one of at least one of $SiO_2$, SiN, AlO, or a mixture of $SiO_2$, SiN, AlO, and the second insulating layer comprise at least one of $SiO_2$, SiN, AlO, or a mixture of $SiO_2$, SiN, AlO.

According to some example embodiments, a field-effect transistor array structure includes a plurality of field-effect transistors.

First gate electrodes of the plurality of field-effect transistors are electrically connected to each other, and second gate electrodes are electrically isolated from each other.

The first conductive layers of the plurality of field-effect transistors are electrically connected to each other, and the second conductive layers are electrically connected to each other.

The first conductive layers of the plurality of field-effect transistors are electrically connected to each other, and the second conductive layers are electrically isolated from each other.

The first conductive layers of the plurality of field-effect transistors are electrically isolated from each other, and the second conductive layers are electrically connected to each other.

The first conductive layers of the plurality of field-effect transistors are electrically isolated from each other, and the second conductive layers are electrically isolated from each other.

The first gate electrodes of the plurality of field-effect transistors are electrically isolated from each other, and the second gate electrodes are electrically isolated from each other.

The first conductive layers of each of the plurality of field-effect transistors are electrically isolated from each other, and the second conductive layers are also electrically isolated from each other.

According to some example embodiments, a method of manufacturing a field-effect transistor includes sequentially stacking a first insulating layer, a first gate electrode, a second insulating layer, and a second conductive layer on a first conductive layer, forming a first hole through the first insulating layer, the first gate electrode, the second insulating layer, and the second conductive layer, the first hole exposing a part of the first conductive layer, forming a first gate insulating layer covering the second conductive layer, a part of the first conductive layer exposed by the first hole, inner walls of the first insulating layer exposed by the first hole, inner walls of the first gate electrode, and inner walls of the second insulating layer exposed by the first hole, the inner walls formed by the first hole, and patterning a part of the first gate insulating layer to expose a part of the first conductive layer and at least a part of the second conductive layer, forming a semiconductor layer covering the part of the first conductive layer exposed through the first hole, through the first gate insulating layer, and through the second conductive layer, forming a second gate insulating layer covering the semiconductor layer, and forming, on the second gate insulating layer, a second gate electrode filling the first hole.

The forming of the first hole comprises etching the first insulating layer, the first gate electrode, the second insulating layer, and the second conductive layer, the etching using an anisotropic etching method.

The method may further comprise, after the forming of the first hole and before the forming of the first gate insulating layer, forming a second hole having a diameter greater than a diameter of the first hole by etching a part of an inner wall of the second conductive layer.

The forming of the second hole may include etching a part of the inner wall of the second conductive layer using an isotropic etching method.

The forming of the first gate insulating layer is performed by using an atomic layer deposition (ALD) method.

The first conductive layer and the second conductive layer comprise at least one of a metal or a metal compound.

The semiconductor layer comprises an oxide semiconductor material.

BRIEF DESCRIPTION OF THE DRAWINGS

The above and other aspects, features, and/or advantages of some example embodiments will be more apparent from the following description taken in conjunction with the accompanying drawings, in which.

DETAILED DESCRIPTION OF SOME EXAMPLE EMBODIMENTS

Figure 1:
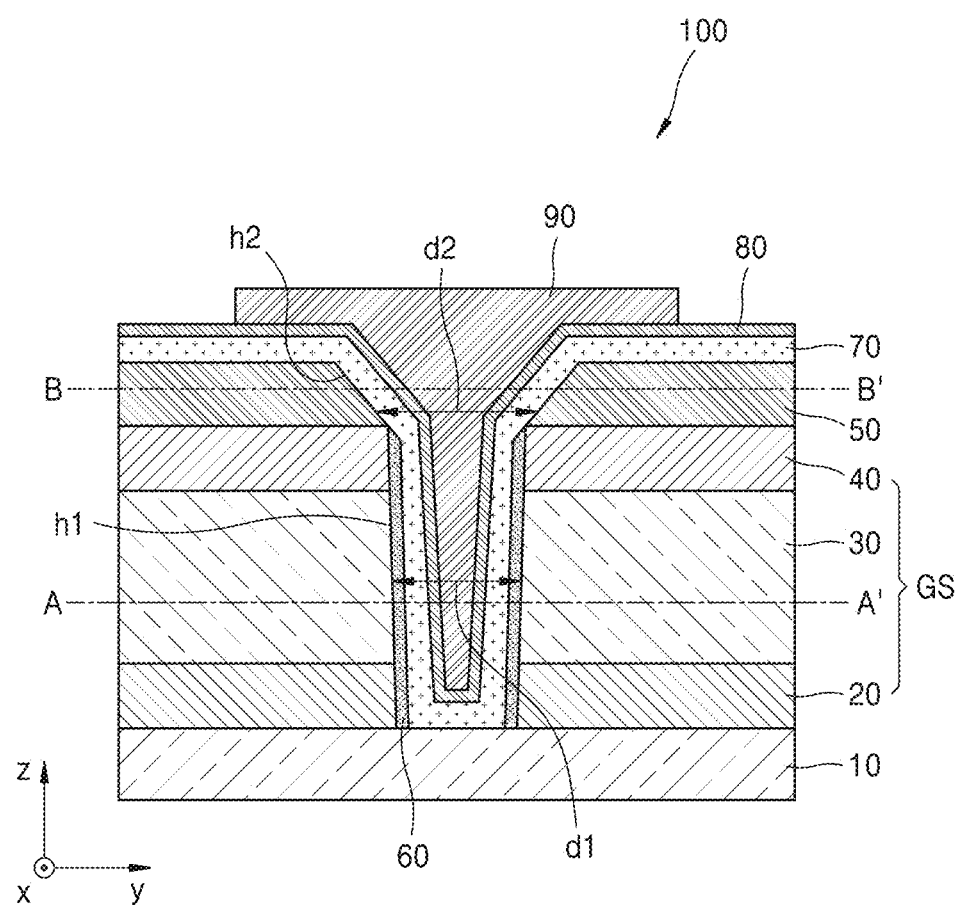
FIG. 1 is a schematic side cross-sectional view of an example configuration of a field-effect transistor according to some example embodiments.

Reference will now be made in detail to some example embodiments, examples of which are illustrated in the accompanying drawings, wherein like reference numerals refer to like elements throughout. In this regard, example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, a size or a thickness of each element in the drawings may be exaggerated for clarity and convenience of explanation.

Hereinafter, the expression "above" or "on" may indicate not only a case in which an element is directly above and in contact with another element, but also a case in which the element is above but is not in contact with the other element. As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

The term "the" and other equivalent determiners may correspond to a singular referent or a plural referent. The use of all examples or terms is to specifically describe the disclosure, and unless otherwise defined by the claims, the scope of the disclosure is not limited by these examples or terms.

Although the terms first, second, etc. may be used herein to describe various elements, the terms do not limit the components. These terms are only used to distinguish one element from another.

Unless orders of operations included in a method are specifically described or there are contrary descriptions, the operations may be performed according to appropriate orders. The use of all example terms (e.g., etc.) are merely for describing the disclosure in detail and the disclosure is not limited to the examples and the example terms, unless they are defined in the scope of the claims.

Figure 2:
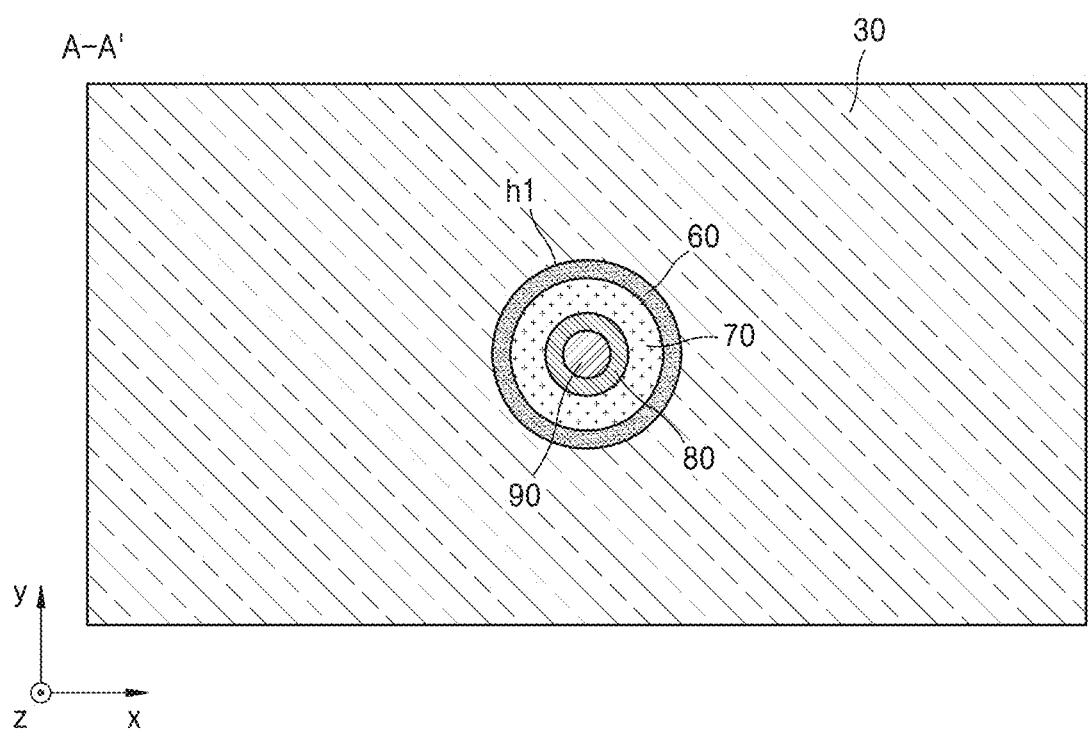
FIG. 2 is a schematic cross-sectional view of the field-effect transistor of FIG. 1 taken along line A-A'.
Figure 3:
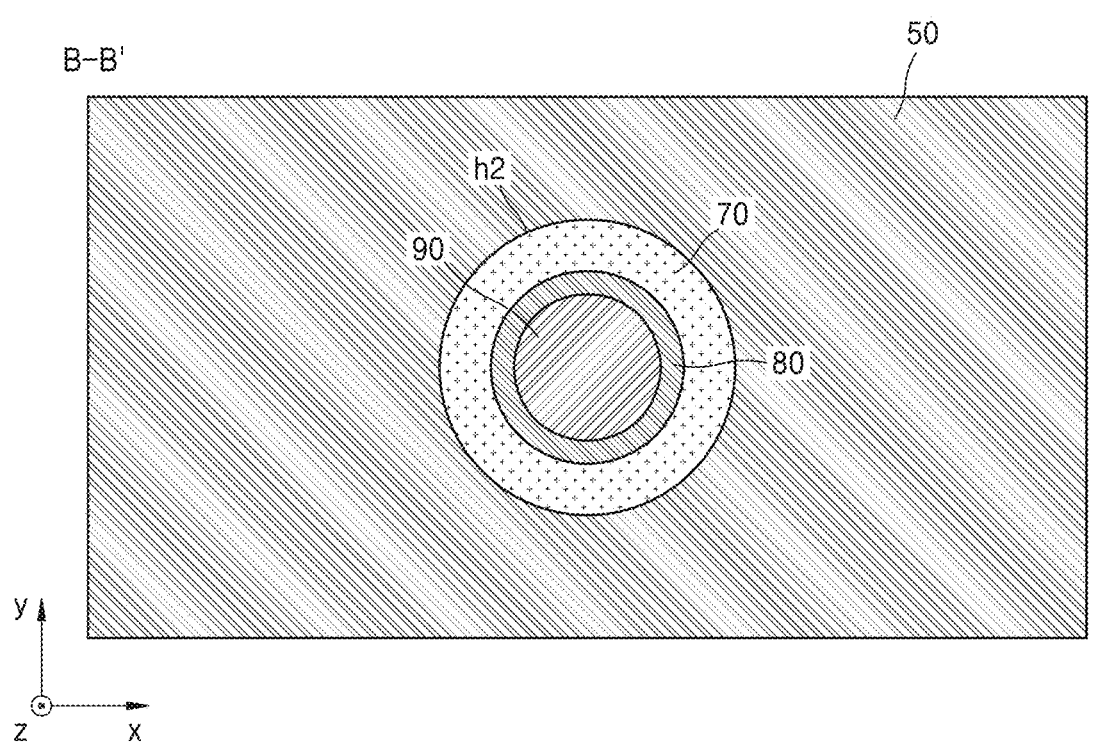
FIG. 3 is a schematic cross-sectional view of the field-effect transistor of FIG. 1 taken along line B-B'.

FIG. 1 is a schematic side cross-sectional view of an example configuration of a field-effect transistor 100 according to some example embodiments. FIG. 2 is a schematic cross-sectional view of the field-effect transistor 100 of FIG. 1 taken along line A-A'. FIG. 3 is a schematic cross-sectional view of the field-effect transistor 100 of FIG. 1 taken along line B-B'.

Referring to FIG. 1, the field-effect transistor 100 may include a first conductive layer 10, a gate structure GS including a structure in which a first insulating layer 20, a first gate electrode 30, and a second insulating layer 40 are sequentially stacked on the first conductive layer 10, and a first hole h1 that is formed through the first insulating layer 20, the first gate electrode 30, and the second insulating layer 40 to expose a part of the first conductive layer 10 and the second conductive layer 50 on the second insulating layer 40. The gate structure GS may also include a second hole h2 connected to the first hole h1 and formed to expose a part of the first conductive layer 10, a first gate insulating layer 60 covering an inner wall of the gate structure GS formed by the first hole h1, a semiconductor layer 70 covering a part of the first conductive layer 10 exposed through the first hole h1 and the second hole h2, the first gate insulating layer 60, and the second conductive layer 50, a second gate insulating layer 80 covering the semiconductor layer 70, and a second gate electrode 90 on the second gate insulating layer 80 and filled in the first and second holes h1 and h2.

The first conductive layer 10 on a lower portion of the field-effect transistor 100 and the second conductive layer 50 on an upper portion thereof may function as or correspond to a source electrode and a drain electrode (or conversely, the drain electrode and the source electrode), respectively. Alternatively or additionally, the semiconductor layer 70 extends in a vertical direction, and thus the semiconductor layer 70 may be in contact with the first conductive layer 10 on the lower portion of the field-effect transistor 100 and the second conductive layer 50 on the upper portion thereof. The semiconductor layer 70 extending in the vertical direction may function as a channel layer, e.g. a layer in which conduction between a source electrode and a drain electrode may occur. For example, the semiconductor layer 70 may be formed to extend in a first direction (a z-axis direction) perpendicular to an upper xy plane of the first conductive layer 10. An outer peripheral surface of the semiconductor layer 70 may be surrounded by the first gate electrode 30, and the second gate electrode 90 may be filled in a certain space formed by an inner peripheral surface of the semiconductor layer 70. As such, the semiconductor layer 70 may be disposed between the first gate electrode 30 and the second gate electrode 90. Hereinafter, components of the field-effect transistor 100 will be described in detail with reference to the drawings.

Referring to FIG. 1, the first insulating layer 20, the first gate electrode 30, and the second insulating layer 40 included in the gate structure GS may be sequentially stacked on the first conductive layer 10 in the first direction (the z-axis direction). A part of the upper xy plane of the first conductive layer 10 may be exposed through the first hole h1 in the gate structure GS and the second hole h2 in the second conductive layer 50. The xy plane may be a plane perpendicular to the first direction (the z-axis direction), and may be parallel to a surface of a substrate (not shown).

The first conductive layer 10 and the second conductive layer 50 may include a conductive material. For example, the first conductive layer 10 and/or the second conductive layer 50 may include a metal or a metal compound, and may include or consist of the same, or different, material. When the first conductive layer 10 and the second conductive layer 50 including the metal or the metal compound are in contact with a separate external electrode (not shown) for applying an electric signal such as a voltage difference between a source and a drain, the first conductive layer 10 and the second conductive layer 50 may form an ohmic contact with the external electrode. In contrast, when the first conductive layer 10 and the second conductive layer 50 do not include the metal or the metal compound and include another specific material, the first conductive layer 10 or the second conductive layer 50 may not form the ohmic contact even in contact with the external electrode. In this case, a separate ohmic contact forming layer may be further disposed between the first conductive layer 10 and/or the second conductive layer 50 and the external electrode. Meanwhile, the first conductive layer 10 and the second conductive layer 50 may include various conductive materials other than the metal or the metal compound.

The first insulating layer 20 and the second insulating layer 40 may include an insulating material, and may or may not include or consist of the same material. For example, the first insulating layer 20 and/or the second insulating layer 40 may include at least one of $SiO_2$, SiN, and AlO, or a mixture thereof. However, example embodiments are not limited thereto, and the first insulating layer 20 and the second insulating layer 40 may include various other insulating materials. The first insulating layer 20 may be disposed between the first conductive layer 10 and the first gate electrode 30 so that the first conductive layer 10 and the first gate electrode 30 are insulated from each other. Alternatively or additionally addition, the second insulating layer 40 may be disposed between the first gate electrode 30 and the second conductive layer 50 so that the first gate electrode 30 and the second conductive layer 50 are insulated from each other.

The first gate electrode 30 and the second gate electrode 90 may include a conductive material, and may or may not include or consist of the same material. For example, the first gate electrode 30 and the second gate electrode 90 may include a metal and/or a metal compound. However, example embodiments are not limited thereto, and the first gate electrode 30 and the second gate electrode 90 may include various conductive materials other than the metal or the metal compound.

The first hole h1 may be formed in a part of the gate structure GS formed by stacking the first insulating layer 20, the first gate electrode 30, and the second insulating layer 40. A part of the first conductive layer 10 on a lower portion of the gate structure GS may be exposed through or by the first hole h1. The first hole h1 may be formed through the first insulating layer 20, the first gate electrode 30 and the second insulating layer 40, and thus an inner wall of the gate structure GS may be formed, and may be exposed by the first hole. A shape of an inner space of the first hole h1 may have a cylindrical shape. However, example embodiments is not limited thereto, and the shape of the inner space of the first hole h1 may be a square column shape and/or a polygonal column shape and/or an oval cylindrical shape. Accordingly, a diameter d1 of the first hole h1 may be constant or substantially constant according to the depth. However, example embodiments are not limited thereto, and the first hole h1 may be formed with the diameter d1 decreasing or increasing according to the depth; e.g. the first hole h1 may have a tapered profile.

The second conductive layer 50 may be disposed on the second insulating layer 40. The second hole h2 may be formed in a part of the second conductive layer 50. The second hole h2 may be connected to (e.g. contiguous with) the first hole h1 to expose a part of the first conductive layer 10. The second hole h2 may have a tapered shape. In this case, a diameter d2 of the second hole h2 may vary depending on a depth thereof. For example, the diameter d2 of the second hole h2 may gradually increase in a direction away from the first conductive layer 10. Accordingly, because an aspect ratio of the second gate electrode 90 filling the first hole h1 and the second hole h2 is reduced, the second gate electrode 90 may be more efficiently formed. However, example embodiments are not limited thereto, and the second hole h2 may have a curved shape on a side surface thereof. For example, the inner wall of the second conductive layer 50 formed by the second hole h2 may be rounded to have a certain curved shape curved concavely and/or convexly, and accordingly, the curved shape may be included on the side surface of the second hole h2.

The first gate insulating layer 60 may be formed to cover the inner wall of the gate structure GS formed by the first hole h1. For example, the first gate insulating layer 60 may have a form of a thin film formed by extending in a stacking direction of the gate structure GS, for example, in the first direction (the z-axis direction). For example, the first gate insulating layer 60 may have a tube shape in the form of a thin film surrounding a side surface of a cylindrical inner space. However, example embodiments are not limited thereto, and when the shape of the inner space of the first hole h1 is the square column shape and/or the polygonal column shape, the first gate insulating film 60 may have an angled tube shape in the form of a thin film surrounding a side surface of an inner space of the square column shape or the polygonal column shape.

Further, referring to FIG. 2, the first gate insulating layer 60 may surround the semiconductor layer 70 in the first hole h1. For example, the first gate insulating layer 60 may have a shape of the thin film connected in a circumferential direction of the semiconductor layer 70 to cover the inner wall of the gate structure GS. The first gate insulating layer 60 may be disposed between the outer wall of the semiconductor layer 70 and the inner wall of the gate structure GS so that the semiconductor layer 70 and the gate structure GS are insulated or isolated from each other.

Referring back to FIG. 1, the inner wall of the gate structure GS may be covered by the first gate insulating layer 60 having such a shape of the thin film. However, the first gate insulating layer 60 may not cover the second conductive layer 50. For example, the first gate insulating layer 60 may not cover an inner wall of the second conductive layer 50 formed by the second hole h2 and an upper surface of the second conductive layer 50. The inner wall of the second conductive layer 50 and the upper surface of the second conductive layer 50 not covered by the first gate insulating layer 60 may be covered by the semiconductor layer 70.

The first gate insulating layer 60 may include a perovskite material. Further, the first gate insulating layer 60 may include a high-k material having a high dielectric constant. For example, the first gate insulating layer 60 may include a dielectric material including titanium (Ti) and at least one of strontium (Sr) and barium (Ba). For example, the first gate insulating layer 60 may include any one of STO, BTO, and BSTO. STO may include $SrTiO_3$. BTO may include $BaTiO_3$. BSTO may include $(Ba, Sr)TiO_3$. $(Ba, Sr)TiO_3$ may include a structure formed by distributing barium (Ba) and strontium (Sr) in a unit cell at a certain ratio. For example, $(Ba, Sr)TiO_3$ may include the structure formed by distributing barium (Ba) and strontium (Sr) in a 1:1 ratio (a 1:1 stoichiometric ratio) in the unit cell. However, example embodiments are not limited thereto, and the first gate insulating layer 60 may include, for example, any one of $PbZr/TiO_3$ and $PbTiO_3$.

Alternatively or additionally, the first gate insulating layer 60 may include a ferroelectric material in which any one or at least one of HfO, $Hf_xZr_{1-x}O$, and ZrO is doped with any one element of Si, Al, Zr, Y, La, Gd, Sr, and Hf. Further, the first gate insulating layer 60 may include any one of $SiO_2$, SiN, AlO, HfO, and ZrO, or a ternary or higher mixture.

In FIG. 1, the first gate insulating layer 60 is illustrated as a single layer, but example embodiments are not limited thereto, and the first gate insulating layer 60 may include a plurality of layers. Each of the plurality of layers may include various types of different materials described above, and may include the same or different materials among the plurality of layers.

The semiconductor layer 70 may cover a part of the first conductive layer 10 exposed through the first hole h1 and the second hole h2, the first gate insulating layer 60 and the second conductive layer 50. The semiconductor layer 70 may have a U-shape inserted into the first hole h1 and the second hole h2. For example, the semiconductor layer 70 may have a shape of a tube with closed one end of a thin film surrounding the side and bottom surfaces of the cylindrical inner space. However, example embodiments are not limited thereto, and when the shape of the inside of the first hole h1 is the square column shape and/or the polygonal column shape, the semiconductor layer 70 may have a shape of a closed tube with angled one end of a thin film surrounding the side surface of the inner space in the square column shape or the polygonal column shape.

Accordingly, the lower portion of the semiconductor layer 70 may cover the part of the first conductive layer 10 exposed through the first hole h1 and the second hole h2. For example, in the shape of the closed tube of the semiconductor layer 70, the closed lower portion of the semiconductor layer 70 may contact the first conductive layer 10. Also, a side portion of the semiconductor layer 70 may cover the first gate insulating layer 60 covering the inner wall of the gate structure GS. Furthermore, the upper portion of the semiconductor layer 70 may cover the second conductive layer 50. Accordingly, the upper portion of the semiconductor layer 70 may extend to cover the upper surface of the second conductive layer 50. The semiconductor layer 70 may not be completely filled in the inner space of the gate structure GS formed by the first hole h1. For example, due to the U-shape included in the semiconductor layer 70, a certain space in which the second gate electrode 90 may be filled and may remain.

Also, referring to FIG. 2, the semiconductor layer 70 may cover the inner wall of the first gate insulating layer 60.

Accordingly, the outer wall of the first gate insulating layer 60 may contact (e.g. may directly contact) the inner wall of the first gate electrode 30, and the inner wall of the first gate insulating layer 60 may contact (e.g. may directly contact) the outer wall of the semiconductor layer 70. Meanwhile, the inner wall of the semiconductor layer 70 may be covered by the second gate insulating layer 80. Further, referring to FIG. 3, above the first hole h1, in a region in which the second hole h2 is provided, the semiconductor layer 70 may cover the inner wall of the second conductive layer 50 formed by the second hole h2. For example, the semiconductor layer 70 may cover a tapered inner wall of the second conductive layer 50 inside the second hole h2. For example, in the region where the second hole h2 is provided, the semiconductor layer 70 and the second conductive layer 50 may directly contact each other.

The semiconductor layer 70 may function as the channel layer of the field-effect transistor 100, e.g. the layer in which accumulation or depletion of charges occur during operation of the field-effect transistor 100. For example, the semiconductor layer 70 may include an oxide semiconductor material. For example, the semiconductor layer 70 may include at least one element selected from In, Zn, Sn, Ga, Al, Mg, Hf, and lanthanide. For example, the semiconductor layer 70 may include at least any one of In—Sn—Ga—Zn—O-based material which is a quaternary metal oxide, In—Ga—Zn—O-based material, In—Sn—Zn—O-based material, In—Sn—Ga—O-based material, In—Al—Zn—O-based material, Sn—Ga—Zn—O-based material, Al—Ga—Zn—O-based material, Sn—Al—Zn—O-based material, In—Hf—Zn—O-based material, In—La—Zn—O-based material, In—Ce—Zn—O-based material, In—Pr—Zn—O-based material, In—Nb—Zn—O-based material, In—Pm—Zn—O-based material, In—Sm—Zn—O-based material, In—Eu—Zn—O-based material, In—Gd—Zn—O-based material, In—Er—Zn—O-based material, In—Tm—Zn—O-based material, In—Yb—Zn—O-based material, and In—Lu—Zn—O-based material which are ternary metal oxides, In—Sn—O-based material, In—Zn—O-based material, Sn—Zn—O-based material, Al—Zn—O-based material, Zn—Mg—O-based material, Sn—Mg—O-based material, In—Mg—O-based material, and In—Ga—O-based material which are binary metal oxides, and In—O-based material, Sn—O-based material, and Zn—O-based material which are primary metal oxides. Here, for example, the In—Ga—Zn—O-based material means an oxide layer including indium (In), gallium (Ga), and zinc (Zn), and there is no particular limitation on a composition ratio. Alternatively or additionally, the In—Ga—Zn—O-based oxide semiconductor may include elements other than In, Ga, and Zn. Here, InSnO may be referred to as ITO, InSnZnO may be referred to as ITZO, and InSnGaO may be referred to as ITGO.

In FIG. 1, the semiconductor layer 70 is illustrated as a single layer, but example embodiments are not limited thereto, and the semiconductor layer 70 may include a plurality of layers.

The second gate insulating layer 80 may cover the semiconductor layer 70. Accordingly, similar to the semiconductor layer 70, the second gate insulating layer 80 may have a U-shape inserted into the first hole h1 and the second hole h2. For example, the second gate insulating layer 80 may have a tube shape with the closed one end of the thin film surrounding the side and bottom surfaces of the cylindrical inner space. However, example embodiments are not limited thereto, and when the shape of the inside of the first hole h1 is the square column shape and/or the polygonal column shape, the second gate insulating layer 80 may have a shape of a closed tube with angled one end of a thin film surrounding the side surface of the inner space in the square column shape or the polygonal column shape. The second gate insulating layer 80 may be fitted in a certain inner space surrounded by the semiconductor layer 70. However, the second gate insulating layer 80 may not be completely filled in the certain inner space surrounded by the semiconductor layer 70. For example, due to the U-shape included in the second gate insulating layer 80, a certain space in which the second gate electrode 90 may be filled may remain.

Alternatively or additionally, the second gate insulating layer 80 may be formed to extend to cover the upper surface of the semiconductor layer 70 formed by extending to cover the upper surface of the second conductive layer 50. Here, the upper surface of the semiconductor layer 70 and the inner wall of the semiconductor layer 70 may be one surface connected to each other. Accordingly, the second gate insulating layer 80 may be formed to be spaced apart from the second conductive layer 50 with the semiconductor layer 70 interposed therebetween.

Also, referring to FIG. 2, the second gate insulating layer 80 may surround a circumference (or a perimeter) of the second gate electrode 90 in the first hole h1. The second gate insulating layer 80 may be disposed between the outer wall of the second gate electrode 90 and the inner wall of the semiconductor layer 70 so that the second gate electrode 90 and the semiconductor layer 70 are insulated from each other. Further, referring to FIG. 3, above the first hole h1, in a region in which the second hole h2 is provided, the second gate insulating layer 80 may be disposed inside the second hole h2 to surround the circumference of the gate electrode 90 having a wider diameter.

The second gate insulating layer 80 may include a perovskite material. Also, the second gate insulating layer 80 may include a high-k material having a high dielectric constant. For example, the second gate insulating layer 80 may include a dielectric material including titanium (Ti) and at least one of strontium (Sr) and barium (Ba). For example, the second gate insulating layer 80 may include any one of STO, BTO, and BSTO. STO may include $SrTiO_3$. BTO may include $BaTiO_3$. BSTO may include $(Ba, Sr)TiO_3$. $(Ba, Sr)TiO_3$ may include a structure formed by distributing barium (Ba) and strontium (Sr) in a unit cell at a certain ratio. For example, $(Ba, Sr)TiO_3$ may include the structure formed by distributing barium (Ba) and strontium (Sr) in a 1:1 ratio in the unit cell. However, example embodiments are not limited thereto, and the second gate insulating layer 80 may include, for example, any one of $PbZr/TiO_3$ and $PbTiO_3$.

Alternatively or additionally, the second gate insulating layer 80 may include a ferroelectric material in which any one or at least one of HfO, $Hf_xZr_{1-x}O$, and ZrO is doped with any one element of Si, Al, Zr, Y, La, Gd, Sr, and Hf. Furthermore, the second gate insulating layer 80 may include any one of $SiO_2$, SiN, AlO, HfO, and ZrO, or a ternary or higher mixture.

In FIG. 1, the second gate insulating layer 80 is illustrated as a single layer, but example embodiments are not limited thereto, and the second gate insulating layer 80 may include a plurality of layers. Each of the plurality of layers may include various types of different materials described above, and may or may not include or consist of the same material.

The second gate electrode 90 may be formed in the remaining region of the first hole h1 and the second hole h2 after the first gate insulating layer 60, the semiconductor layer 70, and the second gate insulating layer 80 are formed in the first hole h1 and the second hole h2. For example, the second gate electrode 90 may have a T-shape. As the second gate electrode 90 of the T-shape is inserted into inner regions of the first hole h1 and the second hole h2, an inserted part of the second gate electrode 90 may be surrounded by the first gate insulating layer 60, the semiconductor layer 70 and the second gate insulating layer 80.

An upper portion of the second gate electrode 90 may be formed to extend to cover at least a part of the upper surface of the second gate insulating layer 80. Also, referring to FIGS. 2 and 3, the second gate electrode 90 may have different diameters in a region in which the first hole h1 is formed and a region in which the second hole h2 is formed. For example, the diameter of the second gate electrode 90 in the region in which the first hole h1 is formed may be smaller than the diameter of the gate electrode 90 in the region in which the second hole h2 is formed. In addition, the diameter of the gate electrode 90 in the region in which the tapered second hole h2 is formed may increase the further away from the first conductive layer 10.

Figure 4:
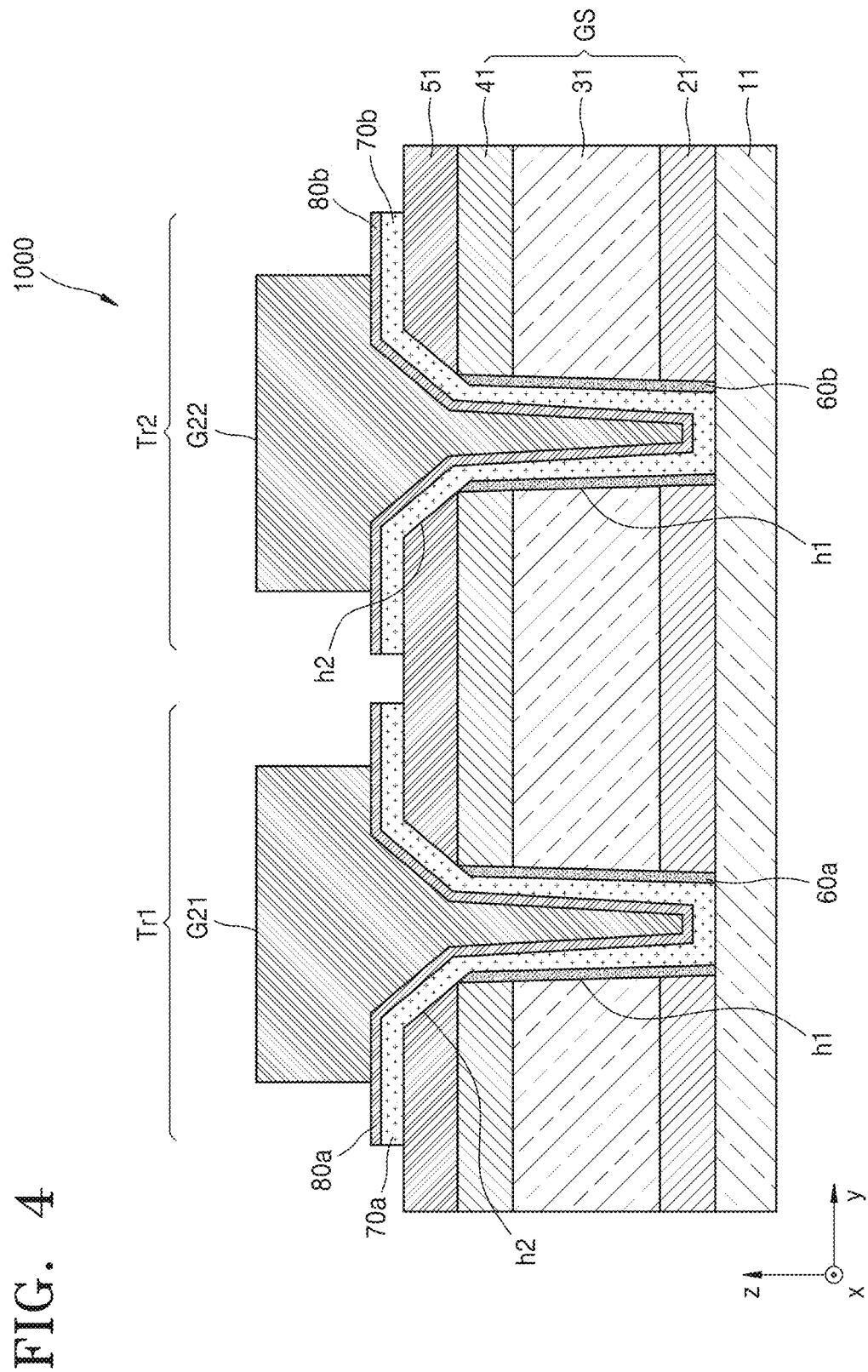
FIG. 4 is a schematic side cross-sectional view of an example configuration of a field-effect transistor array structure according to some example embodiments.
Figure 5:
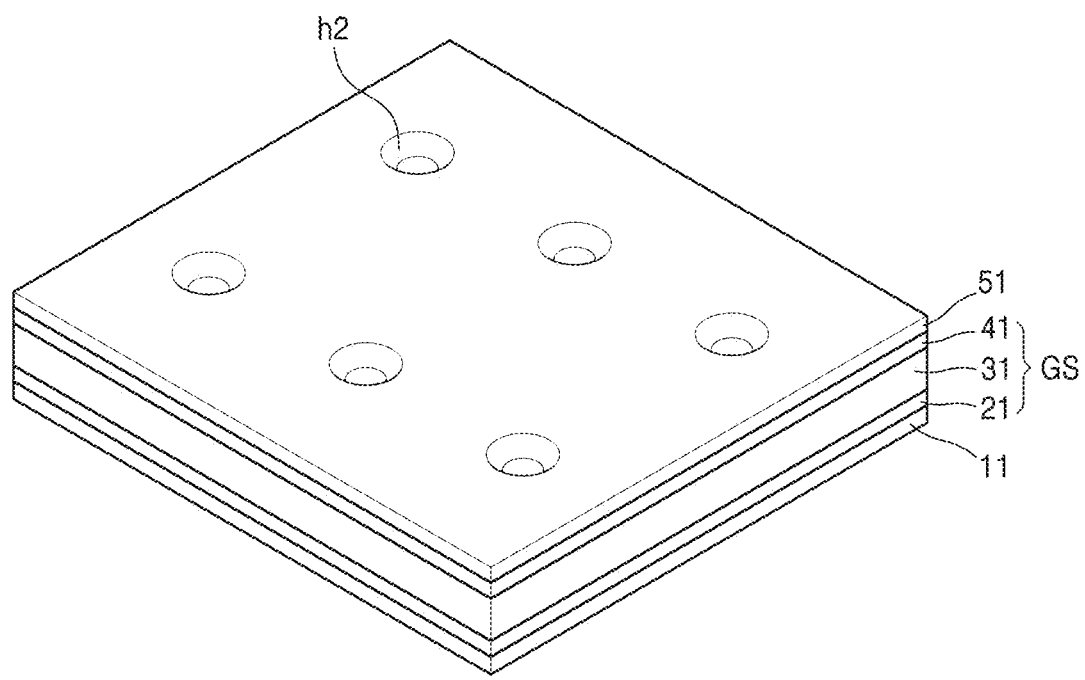
FIG. 5 is a perspective view of a configuration of a second hole included in the field-effect transistor array structure of FIG. 4.
Figure 6:
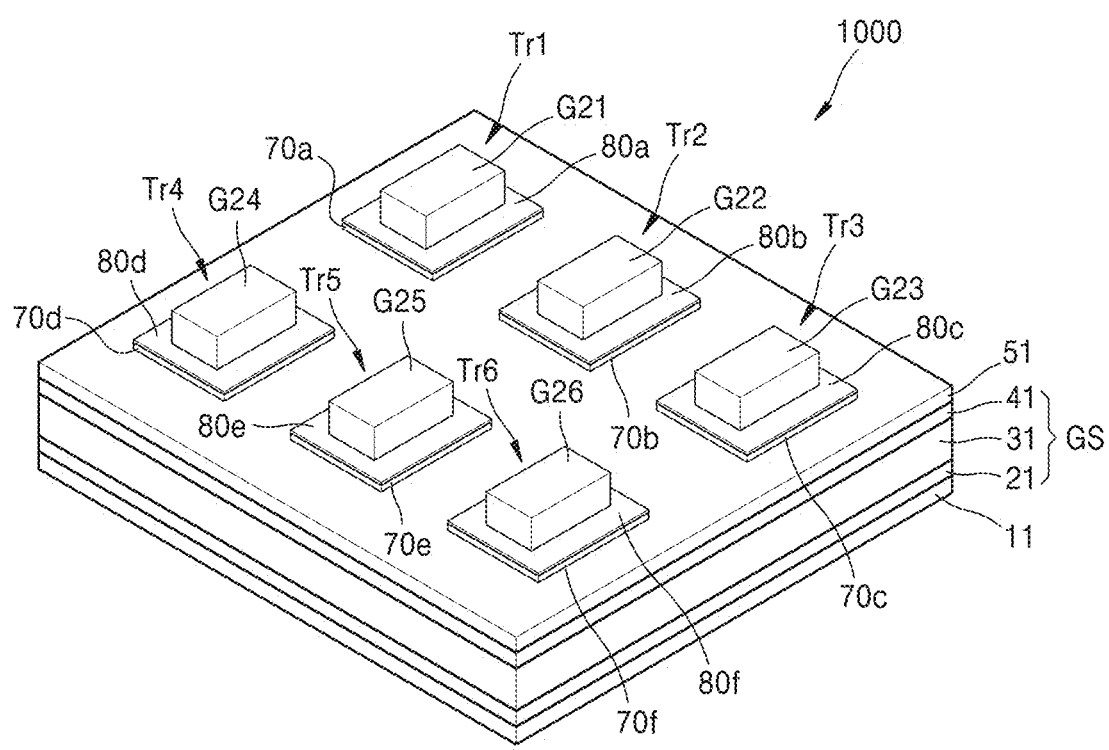
FIG. 6 is a schematic perspective view of an example configuration of the field-effect transistor array structure of FIG. 4.

FIG. 4 is a schematic side cross-sectional view of an example configuration of a field-effect transistor array structure 1000 according to some example embodiments. FIG. 5 is a perspective view of a configuration of the second hole h2 included in the field-effect transistor array structure 1000 of FIG. 4. FIG. 6 is a schematic perspective view of an example configuration of the field-effect transistor array structure 1000 of FIG. 4.

Referring to FIG. 4, the field-effect transistor array structure 1000 may include a plurality of field-effect transistors Tr1 and Tr2. For example, the field-effect transistor array structure 1000 may include a first field-effect transistor Tr1 and a second field-effect transistor Tr2. Only two first and second field-effect transistors Tr1 and Tr2 are shown in FIG. 4, but this is for convenience of description, and the field-effect transistor array structure 1000 may include a myriad of field-effect transistors. The configurations of the first and second field-effect transistors Tr1 and Tr2 described below may be applied to a myriad of field-effect transistors included in the field-effect transistor array structure 1000. The transistor array structure 1000 may be a CMOS array structure. Some of the myriad of first transistors Tr1 and the second transistors Tr2 may operate as NMOS transistors. Additionally or alternatively, of the myriad of first transistors Tr1 and the second transistors Tr2 may operate as PMOS transistors.

Each of the first and second transistors Tr1 and Tr2 may have substantially the same configuration as the field-effect transistor 100 of FIG. 1. In describing FIGS. 4 to 6, descriptions redundant with those of FIGS. 1 to 3 will be omitted.

The field-effect transistor array structure 1000 may include a first conductive layer 11, the gate structure GS including a structure in which a first conductive layer 21, a first gate electrode 31, and a second insulating layer 41 are sequentially stacked on the first conductive layer 11, and the plurality of first holes h1 formed through the first conductive layer 21, the first gate electrode 31, and the second insulating layer 41 expose a part of the first conductive layer 11. The field-effect transistor array structure 1000 may include a second conductive layer 51 on the second insulating layer 41 and including the plurality of second holes h2 respectively connected to the plurality of first holes h1 and formed to expose a part of the first conductive layer 11, a plurality of first gate insulating layers 60a and 60b covering an inner wall of the gate structure GS formed by the plurality of first holes h1, a plurality of semiconductor layers 70a and 70b covering a part of the first conductive layer 11 exposed through the plurality of first holes h1 and second holes h2, the plurality of first gate insulating layers 60a and 60b, and the second conductive layer 51, a plurality of second gate insulating layers 80a and 80b covering the plurality of semiconductor layers 70a and 70b, and a plurality of second gate electrodes GS21 and GS22 on the plurality of second gate insulating layers 80a and 80b and filled in the plurality of first holes h1 and second holes h2.

The first field-effect transistor Tr1 may include a stack structure of the first gate insulating layer 60a that is inserted into a region in which a first pair among the plurality of pairs of first and second holes h1 and h2 is formed and which covers a part of the exposed the first conductive layer 11, the inner wall of the gate structure GS, and the second conductive layer 51, the semiconductor layer 70a, the second gate insulating layer 80a, and the second gate electrode G21.

The second field-effect transistor Tr2 may include a stack structure of the second gate insulating layer 60b that is inserted into a region in which a second pair different from the first pair among the plurality of pairs of first and second holes h1 and h2 is formed and which covers a part of the exposed first conductive layer 11, the inner wall of the gate structure GS, and the second conductive layer 51, the semiconductor layer 70b, the second gate insulating layer 80b, and the second gate electrode G22.

Accordingly, because the first conductive layer 11 includes a single layer, the first conductive layer 11 may function as a common source electrode with respect to the first field-effect transistor Tr1 and the second field-effect transistor Tr2. For example, first conductive layers of a plurality of field-effect transistors including the first and second field-effect transistors Tr1 and Tr2 may be electrically connected to each other. Alternatively or additionally, because the second conductive layer 51 also includes a single layer, the second conductive layer 51 may function as a common drain electrode with respect to the first field-effect transistor Tr1 and the second field-effect transistor Tr2. For example, second conductive layers of the plurality of field-effect transistors including the first and second field-effect transistors Tr1 and Tr2 may be electrically connected to each other. However, example embodiments are not limited thereto, and contrary to the foregoing, the first conductive layer 11 and the second conductive layer 51 may respectively function as common drain and source electrodes with respect to the first field-effect transistor Tr1 and the second field-effect transistor Tr2.

Meanwhile, because the first gate electrode 31 includes a single layer, the first gate electrode 31 may function as a common first gate electrode with respect to the first field-effect transistor Tr1 and the second field-effect transistor Tr2. For example, first gate electrodes of the plurality of field-effect transistors including the first and second field-effect transistors Tr1 and Tr2 may be electrically connected to each other. In contrast, referring to FIGS. 4 to 6, a plurality of second gate electrodes G21, G22, G23, G24, G25, and G26 may be respectively inserted into the plurality of second holes h2 formed in the second conductive layer 51. Accordingly, the plurality of second gate electrodes G21, G22, G23, G24, G25, and G26 may be electrically separated from/electrically isolated from each other, and may respectively function as independent second gate electrodes of a plurality of field-effect transistors Tr1, Tr2, Tr3, Tr4, Tr5, and Tr6.

Figure 7:
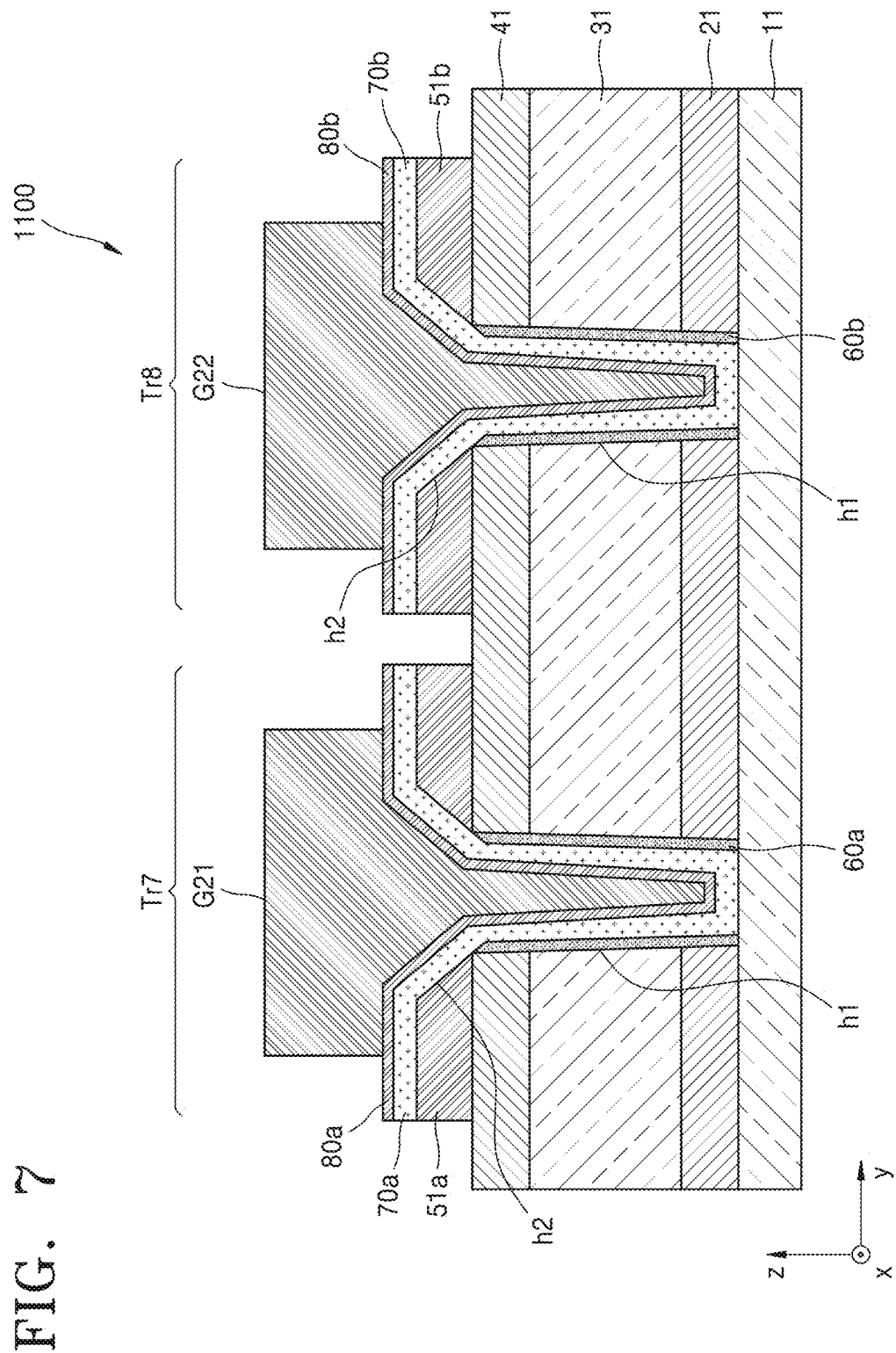
FIG. 7 is a schematic side cross-sectional view of an example configuration of a field-effect transistor array structure according to some example embodiments.

FIG. 7 is a schematic side cross-sectional view of an example configuration of a field-effect transistor array structure 1100 according to some example embodiments. The field-effect transistor array structure 1100 of FIG. 7 may be substantially the same as the field-effect transistor array structure 1000 of FIG. 4 except that the second conductive layer 51*a* of the first field-effect transistor Tr7 and the second conductive layer 51*b* of the second field-effect transistor Tr8 are structurally (e.g. physically) separated from each other and are independently formed. In describing FIG. 7, descriptions redundant with those of FIGS. 1 to 6 will be omitted.

Referring to FIG. 7, the field-effect transistor array structure 1100 may include a plurality of field-effect transistors Tr7 and Tr8. For example, the field-effect transistor array structure 1100 may include the first field-effect transistor Tr7 and the second field-effect transistor Tr8. Only the two first and second field-effect transistors Tr7 and Tr8 are shown in FIG. 7, but this is for convenience of description, and the field-effect transistor array structure 1100 may include a myriad of field-effect transistors. The configurations of the first and second field-effect transistors Tr7 and Tr8 described below may be applied to a myriad of field-effect transistors included in the field-effect transistor array structure 1000.

The first field-effect transistor Tr7 may include the second conductive layer 51*a* formed on the second insulating layer 41 and having the second hole h2 formed therein. The second field-effect transistor Tr8 may include the second conductive layer 51*b* formed on the second insulating layer 41 and having the second hole h2 formed therein. The second conductive layers 51*a* and 51*b* may be formed to be electrically separated/electrically isolated from each other. In this case, the second conductive layer 51*a* may function as a drain electrode of the first field-effect transistor Tr7. Further, the second conductive layer 51*b* may function as a drain electrode of the second field-effect transistor Tr8. For example, the second conductive layer 51*a* of the first field-effect transistor Tr7 and the second conductive layer 51*b* of the second field-effect transistor Tr8 may be independent structures electrically separated/isolated from each other.

Figure 8:
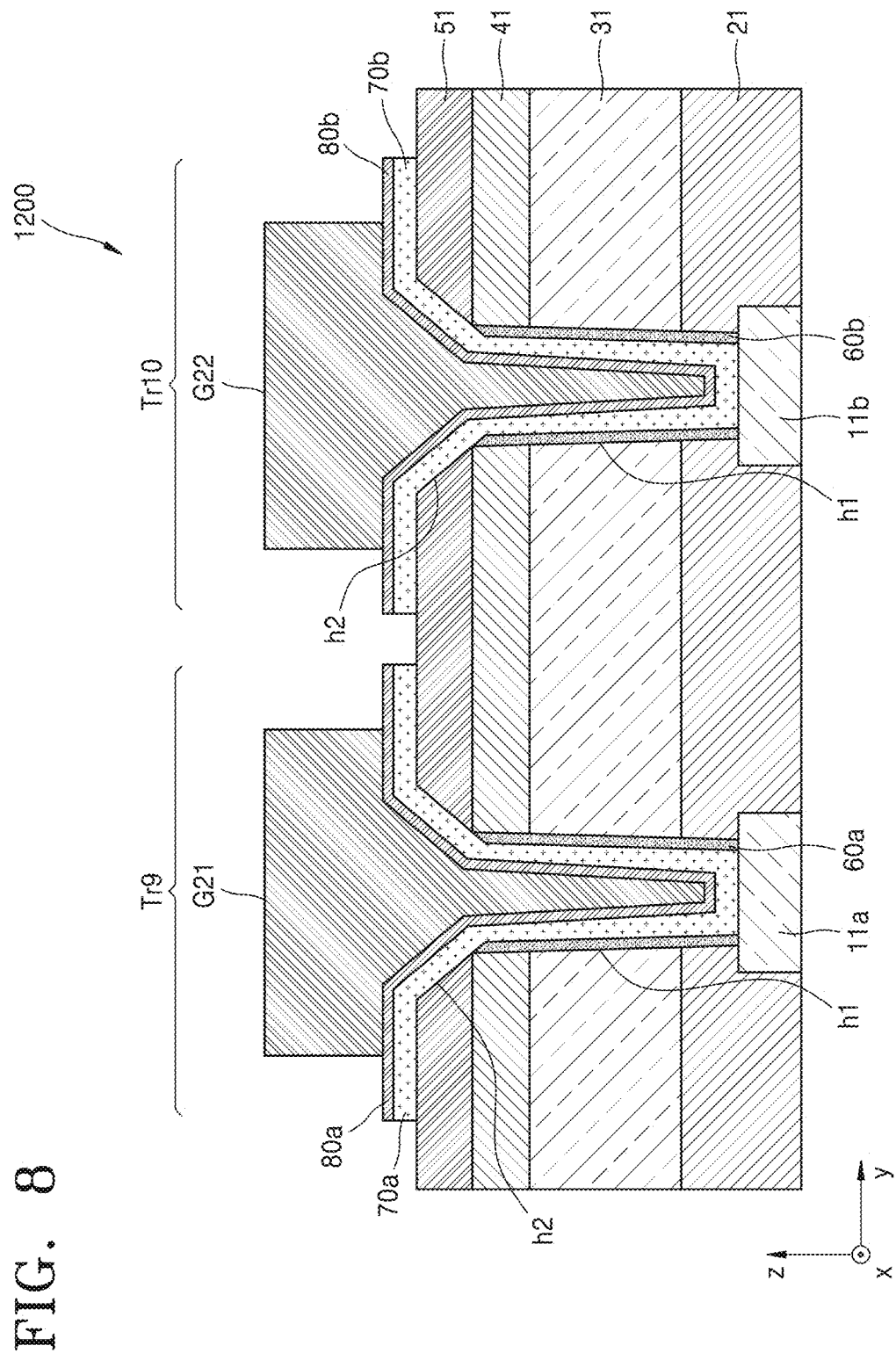
FIG. 8 is a schematic side cross-sectional view of an example configuration of a field-effect transistor array structure according to some example embodiments.

FIG. 8 is a schematic side cross-sectional view of an example configuration of a field-effect transistor array structure 1200 according to some example embodiments. The field-effect transistor array structure 1200 of FIG. 8 may be substantially the same as the field-effect transistor array structure 1000 of FIG. 4 except that the first conductive layer 11*a* of the first field-effect transistor Tr9 and the first conductive layer 11*b* of the first field-effect transistor Tr10 are structurally/physically separated from each other and independently formed. In describing FIG. 8, descriptions redundant with those of FIGS. 1 to 6 will be omitted.

Referring to FIG. 8, the field-effect transistor array structure 1200 may include a plurality of field-effect transistors Tr9 and Tr10. For example, the field-effect transistor array structure 1200 may include the first field-effect transistor Tr9 and the second field-effect transistor Tr10. Only the two first and second field-effect transistors Tr9 and Tr10 are shown in FIG. 8, but this is for convenience of description, and the field-effect transistor array structure 1200 may include a myriad of field-effect transistors. The configurations of the first and second field-effect transistors Tr9 and Tr10 described below may be applied to a myriad of field-effect transistors included in the field-effect transistor array structure 1200.

The first conductive layer 11*a* in contact with a lower portion of the semiconductor layer 70*a* may be on a lower portion of the first field-effect transistor Tr9. In addition, the first conductive layer 11*b* contacting a lower portion of the semiconductor layer 70*b* may be on the lower portion of the second field-effect transistor Tr10. The first conductive layers 11*a* and 11*b* may be formed to be electrically separated from each other. The first conductive layers 11*a* and 11*b* may be covered by the first conductive layer 21 to be electrically separated from each other. In this case, the first conductive layer 11*a* may function as a source electrode of the first field-effect transistor Tr9. Further, the first conductive layer 11*b* may function as a source electrode of the second field-effect transistor Tr10. In other words, the first conductive layer 11*a* of the first field-effect transistor Tr9 and the first conductive layer 11*b* of the second field-effect transistor Tr10 may be independent structures electrically separated from each other.

Figure 9:
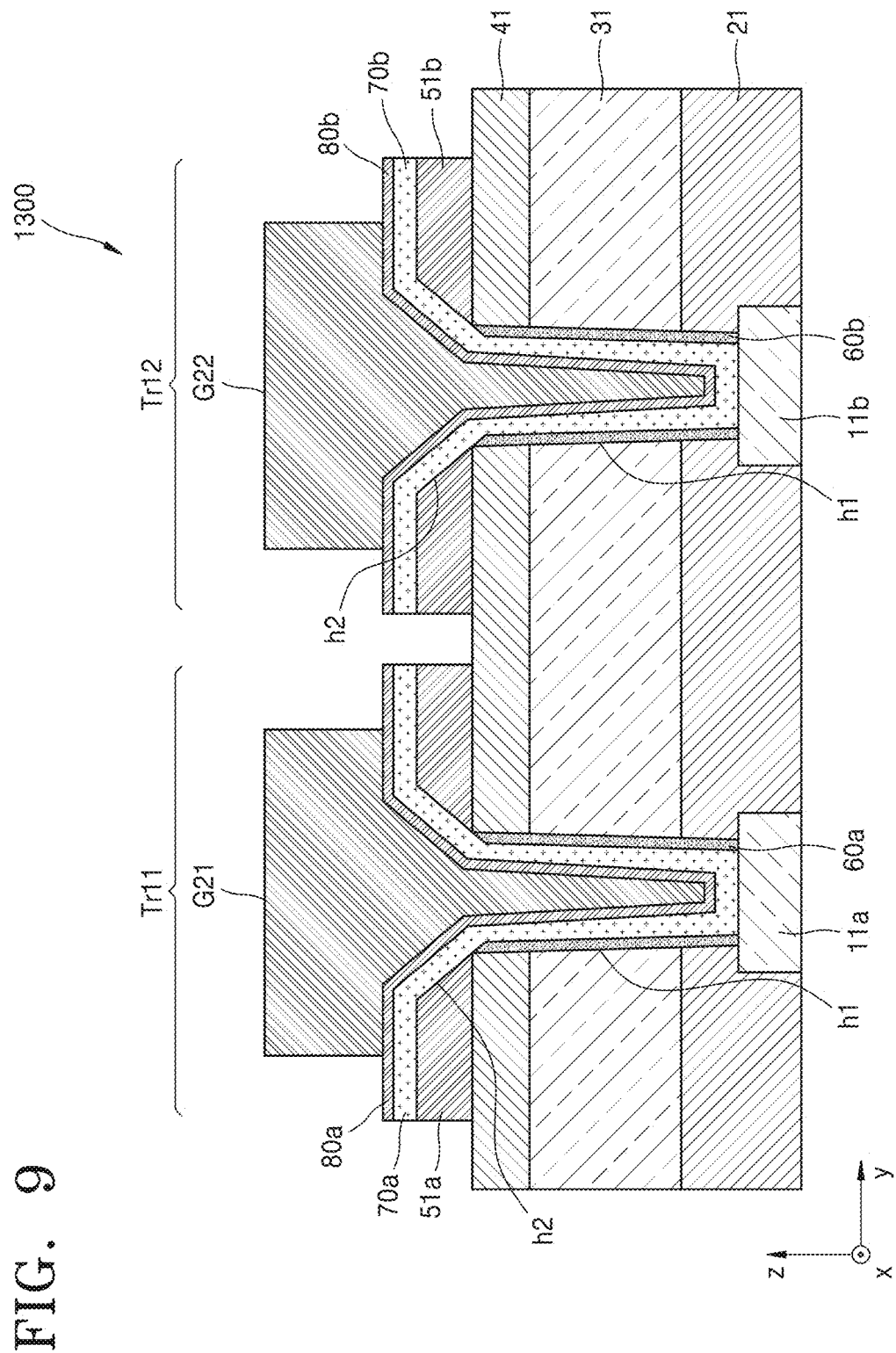
FIG. 9 is a schematic side cross-sectional view of an example configuration of a field-effect transistor array structure according to some example embodiments.

FIG. 9 is a schematic side cross-sectional view of an example configuration of a field-effect transistor array structure 1300 according to some example embodiments. The field-effect transistor array structure 1300 of FIG. 9 may be substantially the same as the field-effect transistor array structure 1100 of FIG. 7 except that the first conductive layer 11*a* of the first field-effect transistor Tr11 and the first conductive layer 11*b* of the first field-effect transistor Tr12 are structurally separated from each other and independently formed. In describing FIG. 9, descriptions redundant with those of FIGS. 1 to 7 will be omitted.

Referring to FIG. 9, the field-effect transistor array structure 1300 may include a plurality of field-effect transistors Tr11 and Tr12. For example, the field-effect transistor array structure 1300 may include the first field-effect transistor Tr11 and the second field-effect transistor Tr12. Only the two first and second field-effect transistors Tr11 and Tr12 are shown in FIG. 9, but this is for convenience of explanation, and the field-effect transistor array structure 1300 may include a myriad of field-effect transistors. The configurations of the first and second field-effect transistors Tr11 and Tr12 described below may be applied to a myriad of field-effect transistors included in the field-effect transistor array structure 1300.

The second conductive layer 51*a* of the first field-effect transistor Tr11 and the second conductive layer 51*b* of the second field-effect transistor Tr12 may be independent structures electrically separated/isolated from each other. The second conductive layer 51*a* of the first field-effect transistor Tr11 and the second conductive layer 51*b* of the second field-effect transistor Tr12 may be substantially the same as, respectively, the second conductive layer 51*a* of the first field-effect transistor Tr7 and the second conductive layer 51*b* of the second field-effect transistor Tr8 shown in FIG. 7.

At the same time, the first conductive layer 11*a* in contact with a lower portion of the semiconductor layer 70*a* may be on a lower portion of the first field-effect transistor Tr11. In addition, the first conductive layer 11*b* in contact with a lower portion of the semiconductor layer 70*b* may be on a lower portion of the second field-effect transistor Tr12. The first conductive layer 11*a* of the first field-effect transistor Tr11 and the first conductive layer 11*b* of the second field-effect transistor Tr12 may be independent structures electrically separated from each other. The first conductive layer 11*a* of the first field-effect transistor Tr11 and the first conductive layer 11*b* of the second field-effect transistor Tr12 may be substantially the same as the first conductive layer 11*a* of the first field-effect transistor Tr9 and the first conductive layer 11*b* of the second field-effect transistor Tr10 shown in FIG. 8.

Figure 10:
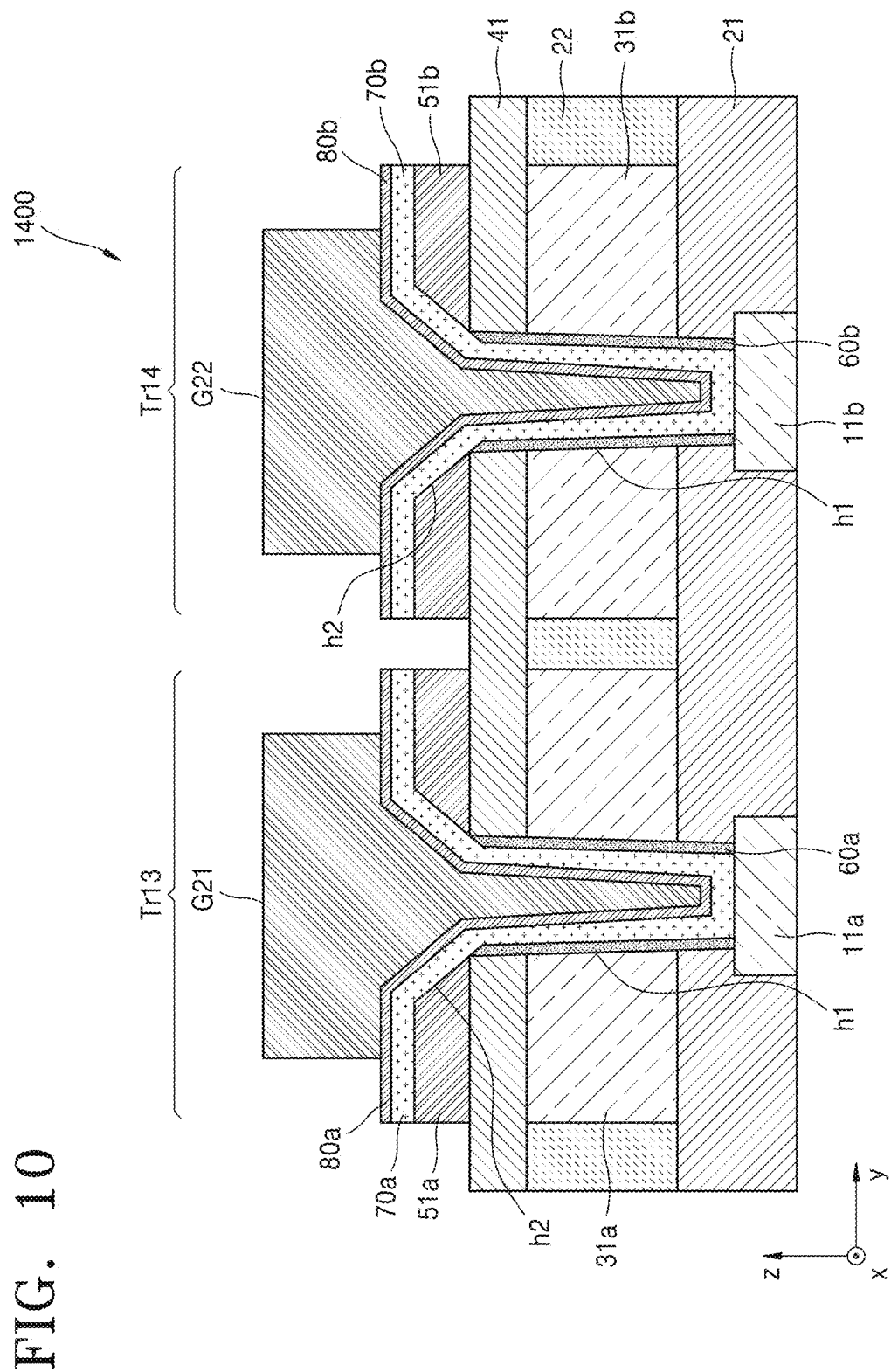
FIG. 10 is a schematic side cross-sectional view of an example configuration of a field-effect transistor array structure according to some example embodiments.

FIG. 10 is a schematic side cross-sectional view of an example configuration of a field-effect transistor array structure 1400 according to some example embodiments. The field-effect transistor array structure 1400 of FIG. 10 may be substantially the same as the field-effect transistor array structure 1300 of FIG. 9 except that the first gate electrode 31a of the first field-effect transistor Tr13 and the first gate electrode 31b of the second field-effect transistor Tr14 are structurally separated from each other and independently formed and field-effect transistor array structure 1400 further includes a third insulating layer 22 that electrically separates the first gate electrodes 31a and 31b. In describing FIG. 10, descriptions redundant with those of FIGS. 1 to 7 and 9 will be omitted.

Referring to FIG. 10, the field-effect transistor array structure 1400 may include a plurality of field-effect transistors Tr13 and Tr14. For example, the field-effect transistor array structure 1400 may include the first field-effect transistor Tr13 and the second field-effect transistor Tr14. Only the two first and second field-effect transistors Tr13 and Tr14 are shown in FIG. 10, but this is for convenience of description, and the field-effect transistor array structure 1400 may include a myriad of field-effect transistors. The configurations of the first and second field-effect transistors Tr13 and Tr14 described below may be applied to a myriad of field-effect transistors included in the field-effect transistor array structure 1400.

The first field-effect transistor Tr13 may include the first gate electrode 31a including the first hole h1 and provided on the first conductive layer 21. The second field-effect transistor Tr14 may include the first gate electrode 31b including the first hole h1 and provided on the first conductive layer 21 to be spaced apart from the first gate electrode 31a of the first field-effect transistor Tr13. The first gate electrodes 31a and 31b respectively included in the first and second field-effect transistors Tr13 and Tr14 may be formed to be electrically separated from each other.

For example, a third insulating layer 22 may be filled between the first gate electrodes 31a and 31b. In other words, the first gate electrodes 31a and 31b may be independently surrounded by the third insulating layer 22, and thus, the first gate electrodes 31a and 31b may be electrically separated from each other. As such, the first gate electrode 31a of the first field-effect transistor Tr13 and the first gate electrode 31b of the second field-effect transistor Tr14 may be independent structures electrically separated/isolated from each other and driven independently from each other.

FIGS. 11 to 21 are diagrams of a method of manufacturing a field-effect transistor according to some example embodiments.

Figure 11:
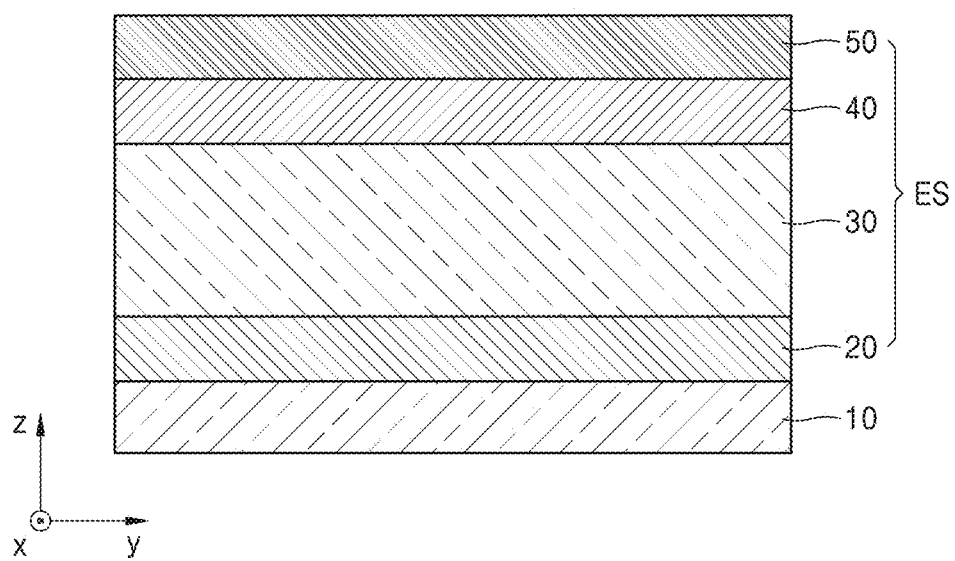
FIGS. 11 to 21 are diagrams showing a method of manufacturing a field-effect transistor according to some example embodiments.

Referring to FIG. 11, the method of manufacturing the field-effect transistor according to some example embodiments may include an operation of sequentially stacking the first insulating layer 20, the first gate electrode 30, the second insulating layer 40, and the second conductive layers 50 on the first conductive layer 10. The first conductive layer 10 may be provided on a substrate (not illustrated). In this case, a structure in which the first insulating layer 20, the first gate electrode 30, the second insulating layer 40, and the second conductive layer 50 are sequentially stacked may be referred to as an electrode structure (ES). The first conductive layer 10 and the second conductive layer 50 may include a metal and/or a metal compound. The first insulating layer 20 and the second insulating layer 40 may include at least one of $SiO_2$, SiN, and AlO, or a mixture thereof. However, example embodiments are not limited thereto, and the first insulating layer 20 and the second insulating layer 40 may include various other insulating materials. The first gate electrode 30 may include a metal and/or a metal compound. However, example embodiments are not limited thereto, and the first gate electrode 30 may include various conductive materials other than the metal or the metal compound.

For example, the first insulating layer 20, the first gate electrode 30, the second insulating layer 40, and the second conductive layers 50 may be sequentially stacked on the first conductive layer 10 by using a method such as at least one of physical vapor deposition (PVD) such as thermal evaporation, E-beam evaporation, and sputtering, chemical vapor deposition (CVD), atomic layer deposition (ALD), etc.

Figure 12:
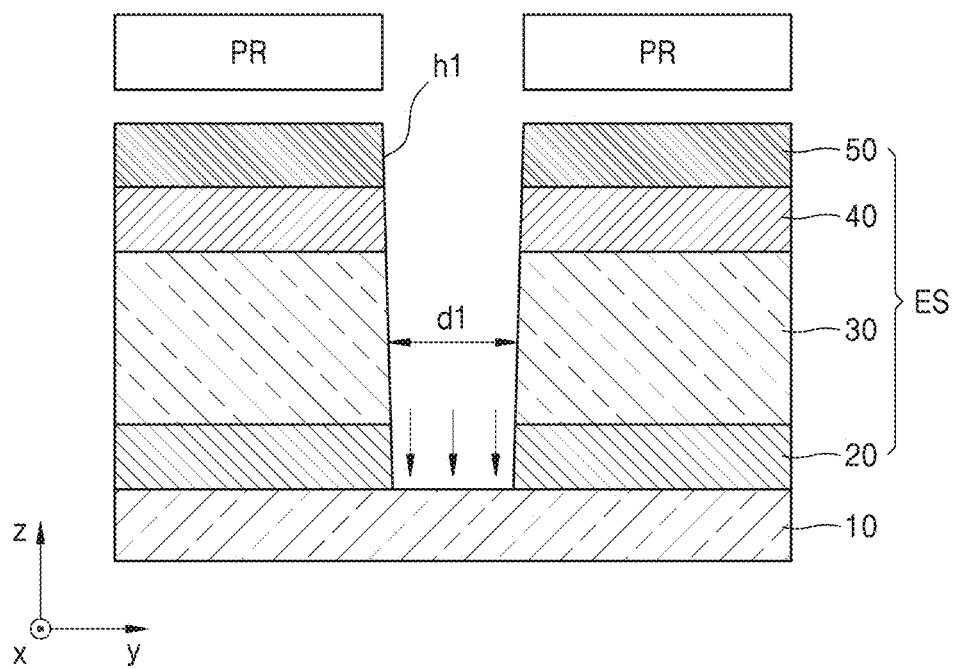
Figure 13:
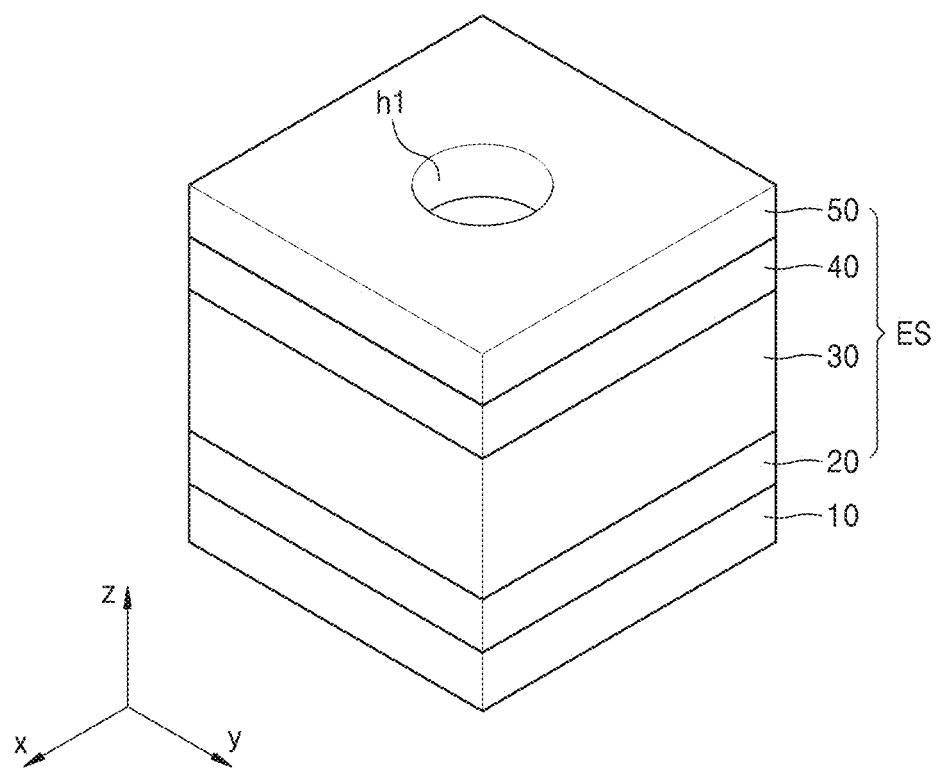

Referring to FIG. 12, the method of manufacturing the field-effect transistor according to some example embodiments may further include an operation of forming the first hole h1 in the electrode structure ES formed on the first conductive layer 10 through a lithography process. In this case, the first hole h1 may be formed in a partial region of the electrode structure ES by using a patterned photoresist layer PR and/or a hardmask layer (not shown). The first hole h1 used to form a channel layer in a direction parallel to a first direction (a z-axis direction) that is a stacking direction of the electrode structure ES may be formed using an anisotropic etching method such as a dry etching method such as a reactive ion etching method. Accordingly, the diameter d1 of the first hole h1 may be constant or substantially constant according to a depth, and may not have a tapered profile. The first hole h1 may be formed through the first insulating layer 20, the first gate electrode 30, the second insulating layer 40, and the second conductive layer 50. The first hole h1 may expose a part of an upper xy plane of the first conductive layer 10. As shown in FIG. 13, a shape of an inner space of the first hole h1 may have a cylindrical shape. However, example embodiments are not limited thereto, and the shape of the inner space of the first hole h1 may be a square column shape and/or a polygonal column shape and/or an oval cylindrical shape.

Figure 14:
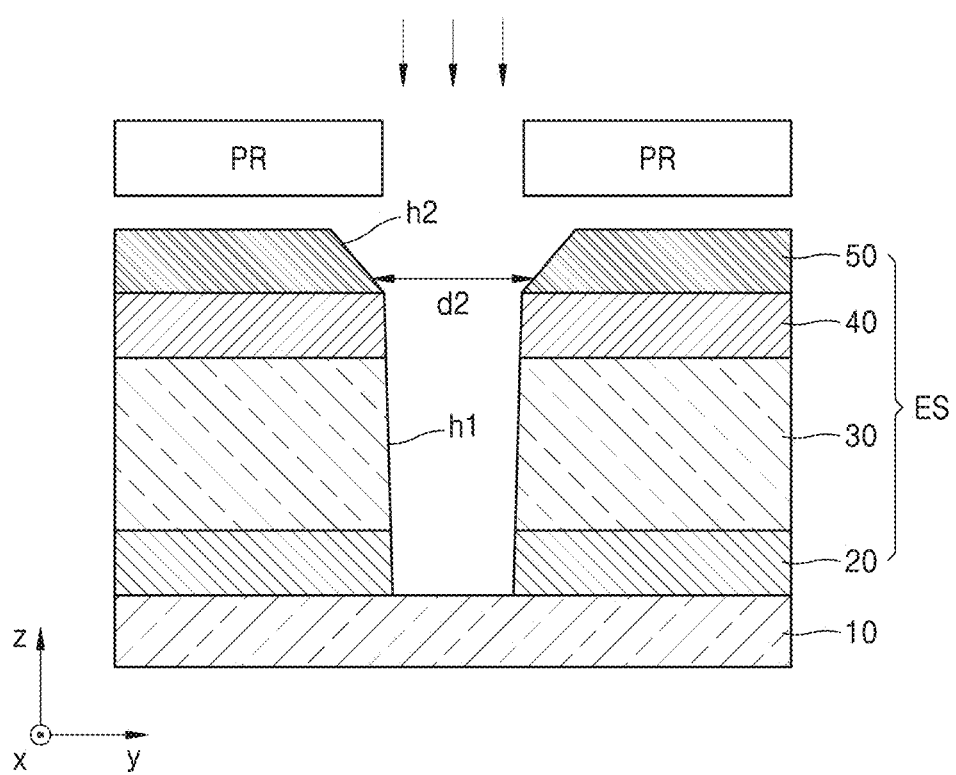
Figure 15:
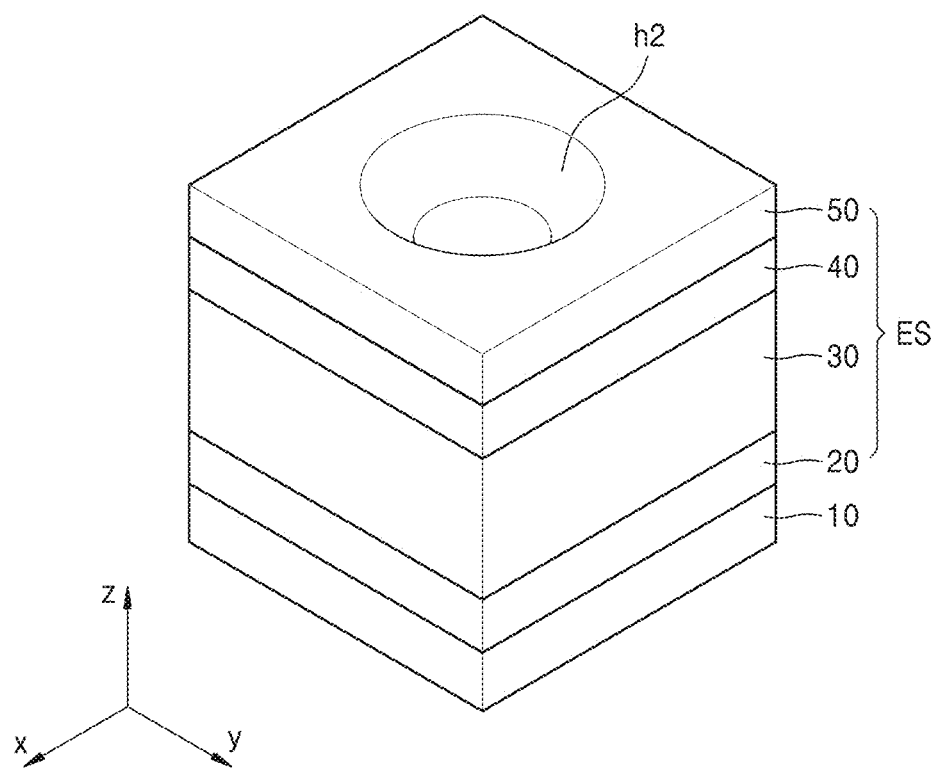

Referring to FIG. 14, the method of manufacturing the field-effect transistor according to some example embodiments may further include an operation of forming the second hole h2 in the second conductive layer 50 through the lithography process. The second hole h2 may be generated by partially deforming the first hole h1. For example, the second hole h2 having a diameter larger than the diameter of the first hole h1 may be formed by etching a part of an inner wall of the second conductive layer 50. In this case, the second hole h2 may be formed by using the patterned photoresist layer PR and/or a patterned hardmask layer (not shown). The second hole h2 may be formed using an isotropic etching method, such as a wet etching method such as a method to etch films with a chemical such as an acid and/or a base. In this case, as shown in FIGS. 14 and 15, the inner wall of the second conductive layer 50 may be etched to have a tapered shape. However, example embodiments are not limited thereto, and the inner wall of the second conductive layer 50 may be etched to have a certain curved shape. Accordingly, the diameter d2 of the second hole h2 may increase the further away from the first conductive layer 10. The second hole h2 is connected to the first hole h1 and may expose a part of the first conductive layer 10.

However, the method of manufacturing/fabricating the field-effect transistor according to some example embodiments does not necessarily include the operation of forming the second hole h2. In this case, according to the method of manufacturing the field-effect transistor according to some example embodiments, the first gate insulating layer 60 covering an inner wall and an upper surface of the electrode structure ES may be formed immediately after the first hole h1 is formed.

Figure 16:
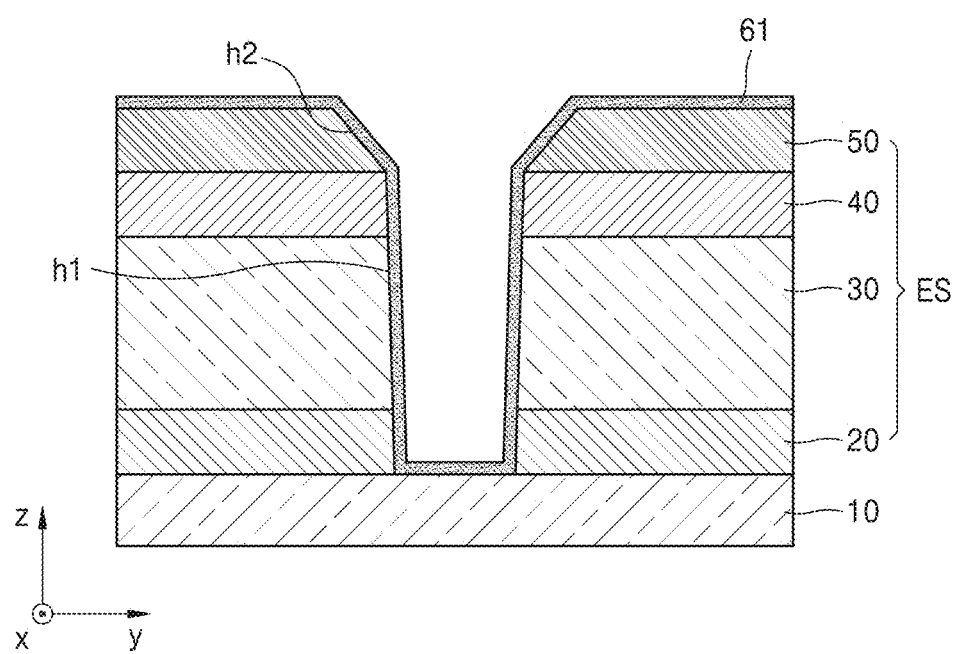

Referring to FIG. 16, the method of manufacturing the field-effect transistor according to some example embodiments may further include an operation of forming the first gate insulating layer 61 covering a part of the first conductive layer 10 exposed through the first hole h1, the inner wall of the electrode structure ES formed by the first hole h1, and the second conductive layer 50. For example, the first gate insulating layer 61 may be formed using an atomic layer deposition (ALD) method. The first gate insulating layer 61 may be formed to be conformal around the first hole h1 and the second hole H2.

The first gate insulating layer 61 may include a perovskite material. Alternatively or additionally, the first gate insulating layer 61 may include a high-k material having a high dielectric constant. For example, the first gate insulating layer 61 may include a dielectric material including titanium (Ti) and at least one of strontium (Sr) and barium (Ba). For example, the first gate insulating layer 61 may include any one of STO, BTO, and BSTO. STO may include $SrTiO_3$. BTO may include $BaTiO_3$. BSTO may include $(Ba, Sr)TiO_3$. $(Ba, Sr)TiO_3$ may include a structure formed by distributing barium (Ba) and strontium (Sr) in a unit cell at a certain ratio. For example, $(Ba, Sr)TiO_3$ may include the structure formed by distributing barium (Ba) and strontium (Sr) in a 1:1 ratio (e.g. a 1:1 stoichiometric ratio) in the unit cell. However, example embodiments are not limited thereto, and the first gate insulating layer 61 may include, for example, any one of $PbZr/TiO_3$ and $PbTiO_3$.

In addition, the first gate insulating layer 61 may include a ferroelectric material in which any one or at least one of HfO, $Hf_xZr_{1-x}O$, and ZrO is doped with/incorporated with any one element of Si, Al, Zr, Y, La, Gd, Sr, and Hf. Further, the first gate insulating layer 61 may include any one of $SiO_2$, SiN, AlO, HfO, and ZrO, and/or a ternary or higher mixture.

Figure 17:
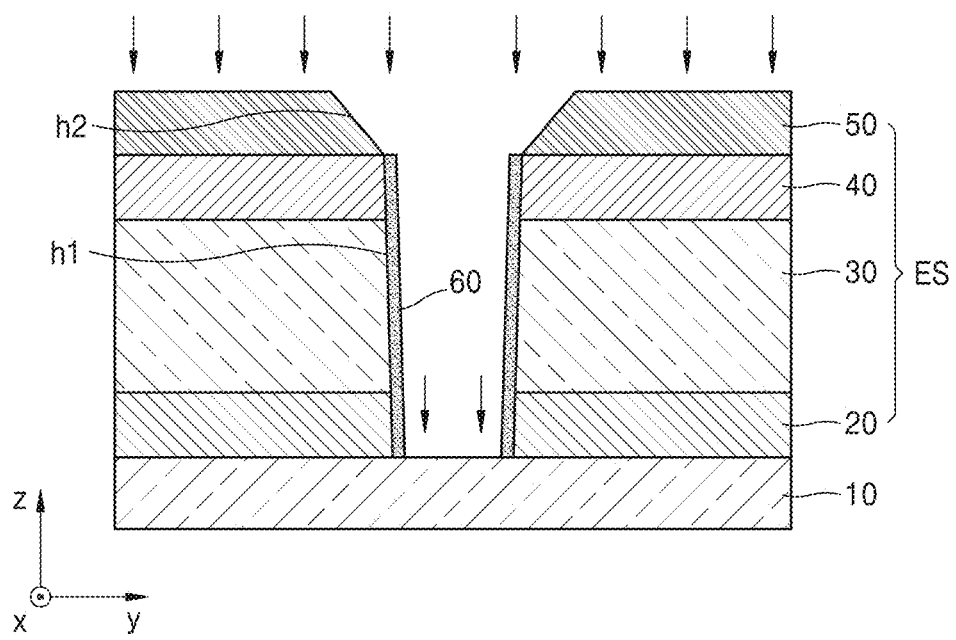

Referring to FIG. 17, the method of manufacturing the field-effect transistor according to some example embodiments may further include an operation of patterning a part of the first gate insulating layer 61 so that a part of the first conductive layer 10 and at least a part of the second conductive layer 50 are exposed. For example, by patterning the first gate insulating layer 61, the first gate insulating layer 60 covering inner walls of the first insulating layer 20, the first gate electrode 30, and the second insulating layer 40 and not covering a part of the first conductive layer 10 exposed by the first conductive layer 10 and the inner wall and the upper surface of the second conductive layer 50 may be formed. Accordingly, the first gate insulating layer 60 may have a shape of a thin film covering only the inner walls of the first insulating layer 20, the first gate electrode 30, and the second insulating layer 40, and not covering the top of the first conductive layer 10 or the sloped sides and top of the second conductive layer 50.

Figure 18:
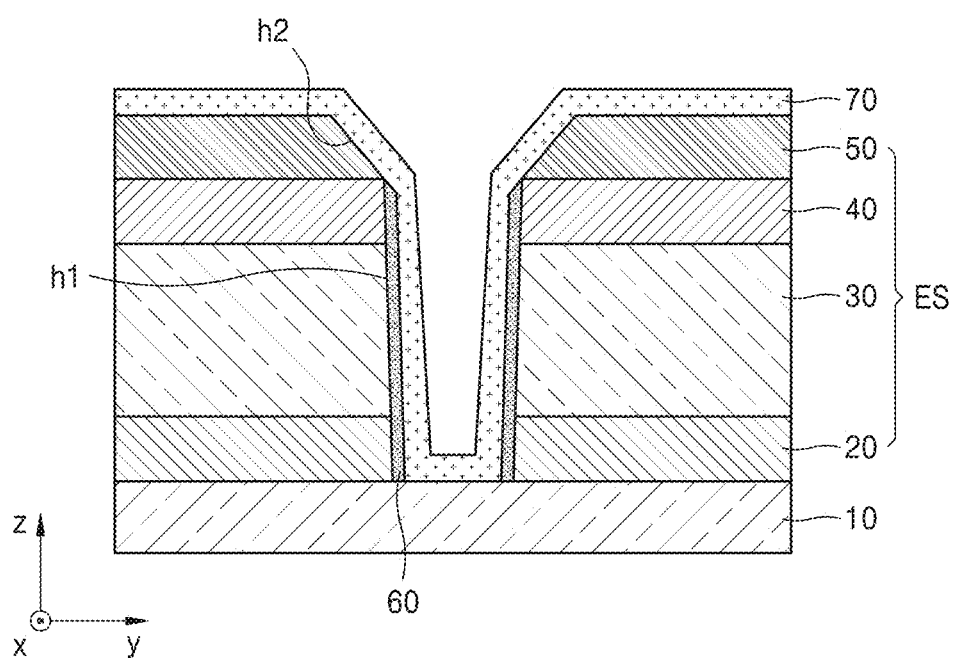

Referring to FIG. 18, the method of manufacturing the field-effect transistor according to some example embodiments may further include an operation of forming the semiconductor layer 70 covering the part of the first conductive layer 10 exposed through the first conductive layer 10, the first gate insulating layer 60, and the second conductive layer 50. For example, the semiconductor layer 70 may be formed using an atomic layer deposition (ALD) method. The semiconductor layer 70 may be formed conformally.

The semiconductor layer 70 may include an oxide semiconductor material. For example, the semiconductor layer 70 may include at least one element selected from In, Zn, Sn, Ga, Al, Mg, Hf, and lanthanide. For example, the semiconductor layer 70 may include at least any one of In—Sn—Ga—Zn—O-based material which is a quaternary metal oxide, In—Ga—Zn—O-based material, In—Sn—Zn—O-based material, In—Sn—Ga—O-based material, In—Al—Zn—O-based material, Sn—Ga—Zn—O-based material, Al—Ga—Zn—O-based material, Sn—Al—Zn—O-based material, In—Hf—Zn—O-based material, In—La—Zn—O-based material, In—Ce—Zn—O-based material, In—Pr—Zn—O-based material, In—Nb—Zn—O-based material, In—Pm—Zn—O-based material, In—Sm—Zn—O-based material, In—Eu—Zn—O-based material, In—Gd—Zn—O-based material, In—Er—Zn—O-based material, In—Tm—Zn—O-based material, In—Yb—Zn—O-based material, and In—Lu—Zn—O-based material which are ternary metal oxides, In—Sn—O-based material, In—Zn—O-based material, Sn—Zn—O-based material, Al—Zn—O-based material, Zn—Mg—O-based material, Sn—Mg—O-based material, In—Mg—O-based material, and In—Ga—O-based material which are binary metal oxides, and In—O-based material, Sn—O-based material, and Zn—O-based material which are primary metal oxides. Here, for example, the In—Ga—Zn—O-based material means an oxide layer including indium (In), gallium (Ga), and zinc (Zn), and there is no particular limitation on a composition ratio. In addition, the In—Ga—Zn—O-based oxide semiconductor may include elements other than In, Ga, and Zn. Here, InSnO may be referred to as ITO, InSnZnO may be referred to as ITZO, and InSnGaO may be referred to as ITGO.

Figure 19:
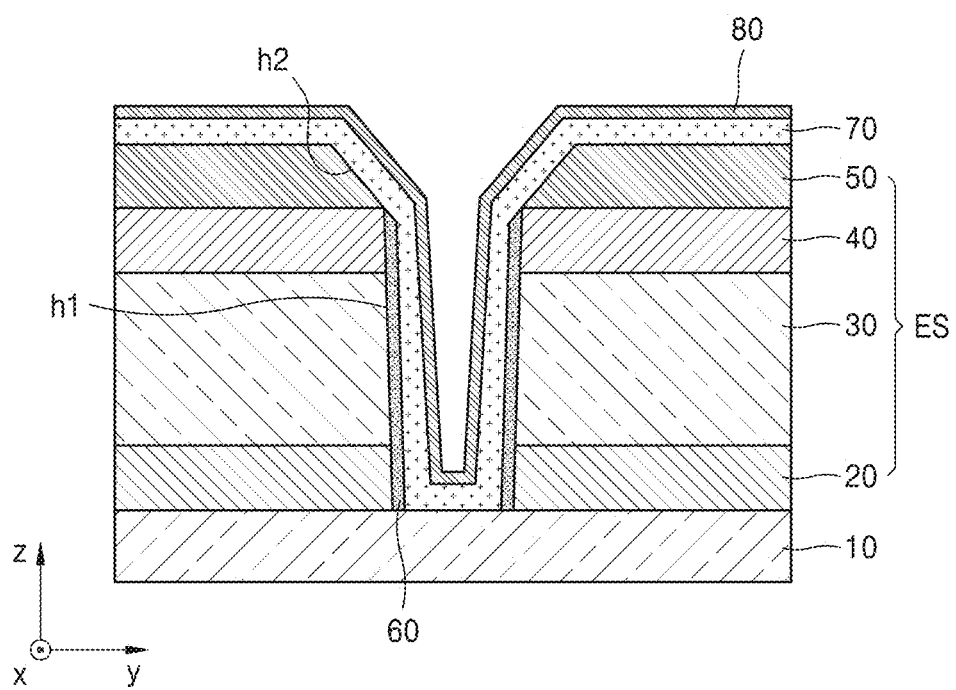

Referring to FIG. 19, the method of manufacturing the field-effect transistor according to some example embodiments may further include an operation of forming the second gate insulating layer 80 covering the semiconductor layer 70. For example, the second gate insulating layer 80 may be formed using an atomic layer deposition (ALD) method. The second gate insulating layer 80 may be formed conformally.

The second gate insulating layer 80 may include a perovskite material. Also, the second gate insulating layer 80 may include a high-k material having a high dielectric constant. For example, the second gate insulating layer 80 may include a dielectric material including titanium (Ti) and at least one of strontium (Sr) and barium (Ba). For example, the second gate insulating layer 80 may include any one of STO, BTO, and BSTO. STO may include $SrTiO_3$. BTO may include $BaTiO_3$. BSTO may include $(Ba, Sr)TiO_3$. $(Ba, Sr)TiO_3$ may include a structure formed by distributing barium (Ba) and strontium (Sr) in a unit cell at a certain ratio. For example, $(Ba, Sr)TiO_3$ may include the structure formed by distributing barium (Ba) and strontium (Sr) in a 1:1 ratio in the unit cell. However, example embodiments are not limited thereto, and the second gate insulating layer 80 may include, for example, any one of $PbZr/TiO_3$ and $PbTiO_3$.

In addition, the second gate insulating layer 80 may include a ferroelectric material in which any one or at least one of HfO, $Hf_xZr_{1-x}O$, and ZrO is doped with any one element of Si, Al, Zr, Y, La, Gd, Sr, and Hf. Furthermore, the second gate insulating layer 80 may include any one of $SiO_2$, SiN, AlO, HfO, and ZrO, or a ternary or higher mixture.

Figure 20:
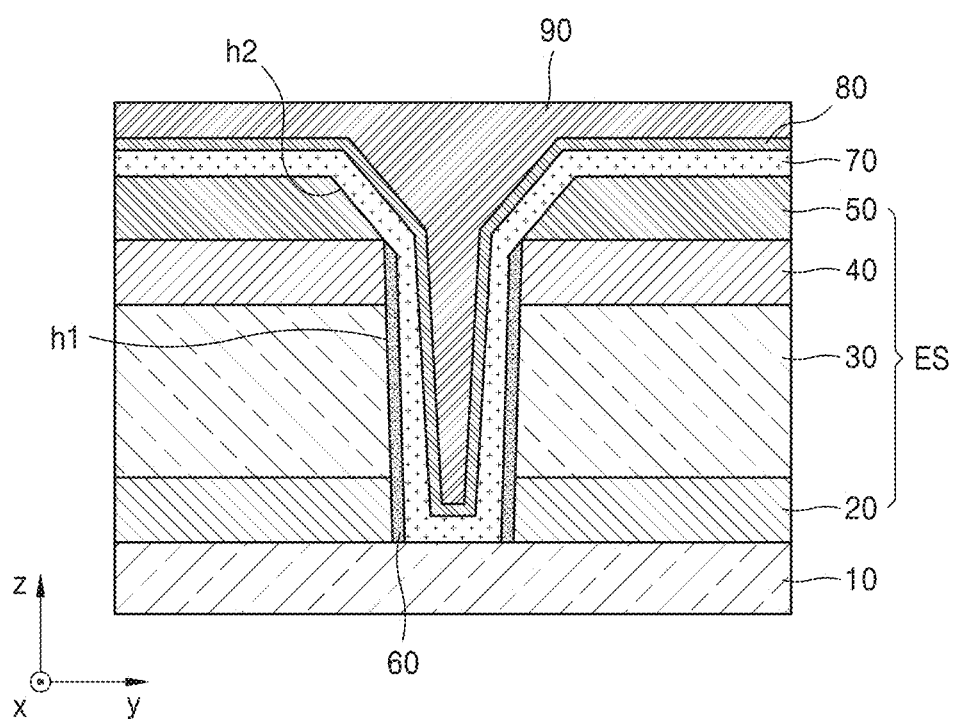

Referring to FIG. 20, the method of manufacturing the field-effect transistor according to some example embodiments may further include an operation of forming the second gate electrode 90 filled in the first hole h1 on the second gate insulating layer 80. The second gate electrode 90 may be filled in the first hole h1 and simultaneously may cover an upper surface of the second gate insulating layer 80. For example, the second gate electrode 90 filled in the first hole h1 may be formed on the second gate insulating layer 80 by using a method such as at least one of physical vapor deposition (PVD) such as thermal evaporation, E-beam evaporation, and sputtering, chemical vapor deposition (CVD), atomic layer deposition (ALD), etc.

The second gate electrode 90 may include a metal and/or a metal compound. However, example embodiments are not limited thereto, and the second gate electrode 90 may include various conductive materials other than the metal or the metal compound.

Figure 21:
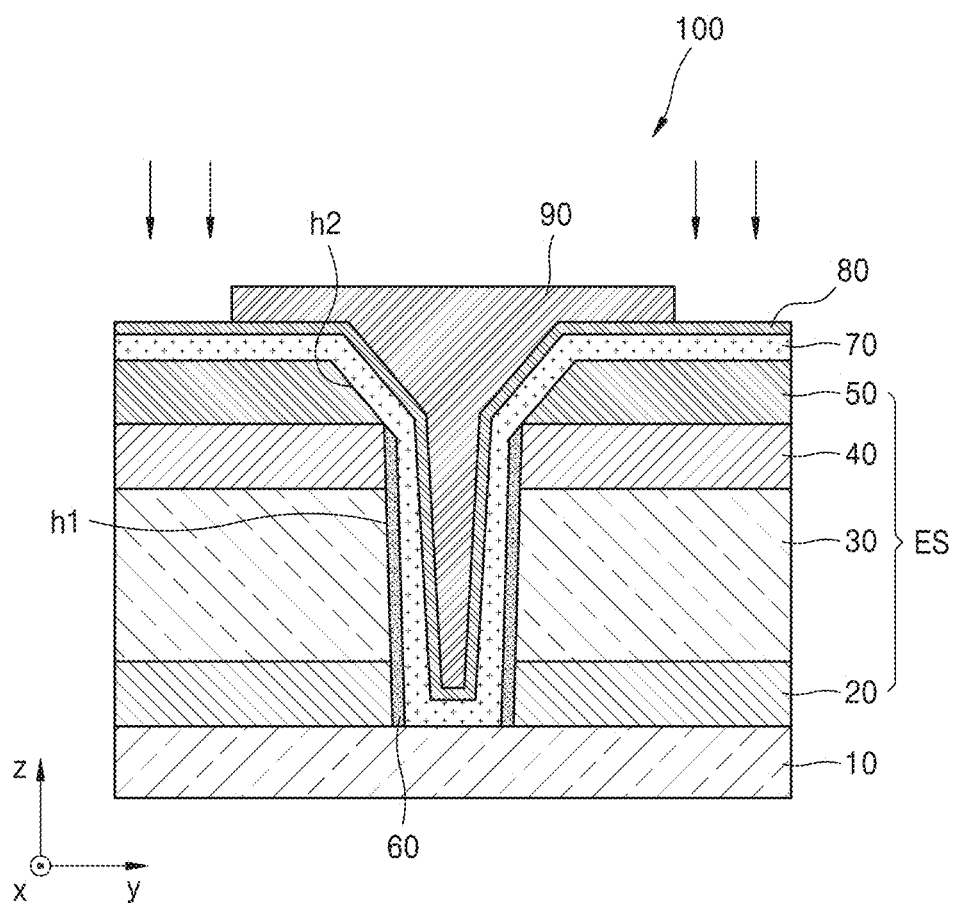

Referring to FIG. 21, the method of manufacturing the field-effect transistor according to some example embodiments may further include an operation of patterning a part of the second gate electrode 90 such that at least a part of the upper surface of the second gate insulating layer 80 is exposed. Accordingly, the second gate electrode 90 may have a shape filled in the first hole h1 and covering the part of the upper surface of the second gate insulating layer 80.

According to the method of manufacturing the field-effect transistor according to some example embodiments described with reference to FIGS. 11 to 21, the field-effect transistor 100 having a double gate structure including the semiconductor layer 70 formed to extend in a vertical direction (a z-axis direction) shown in FIG. 21 and having a function of a channel layer and the first gate electrode 30 and the second gate electrode 90 formed to be spaced apart from each other with the semiconductor layer 70 therebetween may be formed. There may be an improvement in fabrication and/or controllability of a field-effect transistor, and there may be a reduction in short-channel effects of the field-effect transistor 100.

The above-described various embodiments are merely for examples, and those of ordinary skill in the art can understand that various modifications and equivalent other embodiments are possible therefrom. Therefore, the true technical protection scope according to various example embodiments should be determined by the technical idea of the invention described in the following claims.

According to various example embodiments, a field-effect transistor having a double gate structure including a three-dimensional channel layer capable of reducing a short channel effect may be provided.

According to various example embodiments, a 3D double gate field-effect transistor having a structure that does not require a separate process for securing an ohmic contact may be provided. A resistance, e.g. a contact resistance, may be reduced.

It should be understood that example embodiments described herein should be considered in a descriptive sense only and not for purposes of limitation. Descriptions of features or aspects within each embodiment should typically be considered as available for other similar features and/or aspects in other embodiments. Unless clear from context none of the various example embodiments are intended to be mutually exclusive with one another. While one or more embodiments have been described with reference to the figures, it will be understood by those of ordinary skill in the art that various changes in form and details may be made therein without departing from the spirit and scope as defined by the following claims.

What is claimed is:

1. A field-effect transistor comprising:
a first conductive layer;
a gate structure comprising a structure including a first insulating layer, a first gate electrode, and a second insulating layer, the first insulating layer, the first gate electrode, and the second insulating layer being sequentially stacked on the first conductive layer, the gate structure surrounding a first hole through the first insulating layer, the first gate electrode, and the second insulating layer, the first hole exposing a part of the first conductive layer;
a second conductive layer on the second insulating layer, the second conductive layer surrounding a second hole connected to the first hole, the second hole exposing a part of the first conductive layer;
a first gate insulating layer covering an inner wall of the gate structure exposed by the first hole;
a semiconductor layer covering a part of the first conductive layer exposed through the first hole and through the second hole, the first gate insulating layer, and the second conductive layer;
a second gate insulating layer covering the semiconductor layer; and
a second gate electrode on the second gate insulating layer and filling the first hold and the second hole.

2. The field-effect transistor of claim 1, wherein the first conductive layer and the second conductive layer comprise at least one of a metal or a metal compound.

3. The field-effect transistor of claim 1, wherein the second gate insulating layer is apart from the second conductive layer with the semiconductor layer between the second gate insulating layer and the second conductive layer.

4. The field-effect transistor of claim 1, wherein the first gate insulating layer does not cover the second conductive layer.

5. The field-effect transistor of claim 1, wherein the second hole has a tapered shape.

6. The field-effect transistor of claim 1, wherein a diameter of the second hole gradually increases in a direction away from the first conductive layer.

7. The field-effect transistor of claim 1, wherein the semiconductor layer comprises an oxide semiconductor material.

8. The field-effect transistor of claim 7, wherein the oxide semiconductor material comprises an oxide comprising at least one element selected from In, Zn, Sn, Ga, Al, Mg, Hf, and lanthanide elements.

9. The field-effect transistor of claim 1, wherein the first and second gate insulating layers comprise a perovskite material.

10. The field-effect transistor of claim 1, wherein the first and second gate insulating layers comprise a ferroelectric material in which at least one of HfO, $Hf_xZr_{1-x}O$, and ZrO is doped with at least one of Si, Al, Zr, Y, La, Gd, Sr, and Hf.

11. The field-effect transistor of claim 1, wherein the first insulating layer comprises at least one of at least one of $SiO_2$, SiN, AlO, or a mixture of $SiO_2$, SiN, AlO, and the second insulating layer comprise at least one of $SiO_2$, SiN, AlO, or a mixture of $SiO_2$, SiN, AlO.

12. A field-effect transistor array structure comprising a plurality of field-effect transistors, wherein each of the plurality of field-effect transistors comprises the field-effect transistor of claim 1.

13. The field-effect transistor array structure of claim 12, wherein first gate electrodes of the plurality of field-effect transistors are electrically connected to each other, and second gate electrodes are electrically isolated from each other.

14. The field-effect transistor array structure of claim 13, wherein the first conductive layers of the plurality of field-effect transistors are electrically connected to each other, and the second conductive layers are electrically connected to each other.

15. The field-effect transistor array structure of claim 13, wherein the first conductive layers of the plurality of field-effect transistors are electrically connected to each other, and the second conductive layers are electrically isolated from each other.

16. The field-effect transistor array structure of claim 13, wherein the first conductive layers of the plurality of field-effect transistors are electrically isolated from each other, and the second conductive layers are electrically connected to each other.

17. The field-effect transistor array structure of claim 13, wherein the first conductive layers of the plurality of field-effect transistors are electrically isolated from each other, and the second conductive layers are electrically isolated from each other.

18. The field-effect transistor array structure of claim 12, wherein the first gate electrodes of the plurality of field-effect transistors are electrically isolated from each other, and the second gate electrodes are electrically isolated from each other.

19. The field-effect transistor array structure of claim 18, wherein the first conductive layers of each of the plurality of field-effect transistors are electrically isolated from each other, and the second conductive layers are also electrically isolated from each other.

20. A method of manufacturing a field-effect transistor, the method comprising:
   sequentially stacking a first insulating layer, a first gate electrode, a second insulating layer, and a second conductive layer on a first conductive layer;
   forming a first hole through the first insulating layer, the first gate electrode, the second insulating layer, and the second conductive layer, the first hole exposing a part of the first conductive layer;
   forming a first gate insulating layer covering the second conductive layer, a part of the first conductive layer exposed by the first hole, inner walls of the first insulating layer exposed by the first hole, inner walls of the first gate electrode, and inner walls of the second insulating layer exposed by the first hole, the inner walls formed by the first hole;
   patterning a part of the first gate insulating layer to expose a part of the first conductive layer and at least a part of the second conductive layer;
   forming a semiconductor layer covering the part of the first conductive layer exposed through the first hole, through the first gate insulating layer, and through the second conductive layer;
   forming a second gate insulating layer covering the semiconductor layer; and
   forming, on the second gate insulating layer, a second gate electrode filling the first hole.

21. The method of claim 20, wherein the forming of the first hole comprises etching the first insulating layer, the first gate electrode, the second insulating layer, and the second conductive layer, the etching using an anisotropic etching method.

22. The method of claim 20, further comprising:
   after the forming of the first hole and before the forming of the first gate insulating layer, forming a second hole having a diameter greater than a diameter of the first hole by etching a part of an inner wall of the second conductive layer.

23. The method of claim 22, wherein the forming of the second hole comprises etching a part of the inner wall of the second conductive layer using an isotropic etching method.

24. The method of claim 20, wherein the forming of the first gate insulating layer is performed by using an atomic layer deposition (ALD) method.

25. The method of claim 20, wherein the first conductive layer and the second conductive layer comprise at least one of a metal or a metal compound.

26. The method of claim 20, wherein the semiconductor layer comprises an oxide semiconductor material.

* * * * *